United States Patent
Ueno et al.

(10) Patent No.: US 12,550,245 B2
(45) Date of Patent: Feb. 10, 2026

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventors: Yoshifumi Ueno, Oyama (JP); Shogo Kitasaka, Oyama (JP); Yuichi Nishimura, Oyama (JP)

(73) Assignee: Gigaphoton Inc., Tochigi (JP)

( * ) Notice: Subject to any disclaimer, the term of this patent is extended or adjusted under 35 U.S.C. 154(b) by 175 days.

(21) Appl. No.: 18/463,169

(22) Filed: Sep. 7, 2023

(65) Prior Publication Data

US 2024/0126185 A1  Apr. 18, 2024

(30) Foreign Application Priority Data

Oct. 17, 2022 (JP) ................. 2022-166045

(51) Int. Cl.
*H05G 2/00* (2006.01)
*G03F 7/00* (2006.01)

(52) U.S. Cl.
CPC ....... *H05G 2/0027* (2024.08); *G03F 7/70033* (2013.01); *G03F 7/709* (2013.01)

(58) Field of Classification Search
CPC .... H05B 47/115; H05B 47/155; H05B 47/16; H05B 47/165; H05B 47/17; H05G 2/0027; H05G 2/006; H05G 2/008; G03F 7/70033; G03F 7/709; G08G 1/146
See application file for complete search history.

(56) References Cited

U.S. PATENT DOCUMENTS

| | | | |
|---|---|---|---|
| 9,949,354 B2 | 4/2018 | Saito et al. | |
| 10,141,186 B2 | 11/2018 | Hosoda et al. | |
| 10,667,376 B2 * | 5/2020 | Takashima | G03F 7/70033 |
| 10,955,760 B2 * | 3/2021 | Nakano | H05G 2/0023 |
| 10,976,664 B2 * | 4/2021 | Hosoda | H05G 2/0027 |
| 11,067,907 B2 * | 7/2021 | Nakano | G03F 7/70525 |
| 11,229,112 B2 * | 1/2022 | Abe | G03F 7/70033 |
| 12,232,244 B2 * | 2/2025 | Driessen | H05G 2/0023 |
| 2005/0199829 A1 * | 9/2005 | Partlo | H05G 2/0086 |
| | | | 250/504 R |

(Continued)

OTHER PUBLICATIONS

Search Report mailed by the Netherlands Patent Office on Oct. 16, 2025, which corresponds to Dutch Patent Application No. 2035745, and is related to U.S. Appl. No. 18/463,169, with English language Written Opinion.

*Primary Examiner* — Deoram Persaud

(74) *Attorney, Agent, or Firm* — Studebaker Brackett PLLC

(57) ABSTRACT

An extreme ultraviolet light generation apparatus includes a target supply unit, a target passage detection device, a delay circuit, a laser device, a target image capturing device, and a processor. Here, the processor controls the vibrating element to provide irregular intervals between droplet targets adjacent to each other; generates integrated image data by integrating plural pieces of image data imaged at different times; specifies a position, in the integrated image data, of the droplet target most emphasized in the integrated image data; and sets a delay time based on a distance from a position of the most emphasized droplet target to a second detection position.

20 Claims, 16 Drawing Sheets

(56) References Cited

U.S. PATENT DOCUMENTS

| | | | |
|---|---|---|---|
| 2012/0228525 A1* | 9/2012 | Moriya | H05G 2/0027 |
| | | | 250/504 R |
| 2013/0234051 A1* | 9/2013 | Rajyaguru | G03F 7/70033 |
| | | | 250/504 R |
| 2014/0284502 A1* | 9/2014 | Nakano | H05G 2/003 |
| | | | 250/504 R |
| 2017/0064799 A1* | 3/2017 | Yabu | G03F 7/70033 |
| 2018/0007771 A1* | 1/2018 | Satou | H05G 2/0084 |
| 2018/0146536 A1* | 5/2018 | Suzuki | H05G 2/0027 |
| 2018/0173102 A1* | 6/2018 | Yabu | G03F 7/7055 |
| 2018/0288863 A1* | 10/2018 | Fujimaki | H05G 2/0027 |
| 2018/0314161 A1* | 11/2018 | Suzuki | G03F 7/70033 |
| 2023/0300966 A1* | 9/2023 | Kitasaka | H05G 2/0027 |
| | | | 250/504 R |
| 2024/0049378 A1* | 2/2024 | Nakano | H05G 2/0027 |
| 2025/0234444 A1* | 7/2025 | Kitasaka | H05G 2/0027 |

\* cited by examiner

FIG. 15

| NUMBER OF IMAGING TIMES n | APPLICATION VOLTAGE FREQUENCY fnpz (Hz) OF PIEZOELECTRIC ELEMENT |
|---|---|
| 1 | f1pz |
| 2 | f2pz |
| 3 | f3pz |
| 4 | f4pz |
| ⋮ | ⋮ |
| n_target | fnpz |

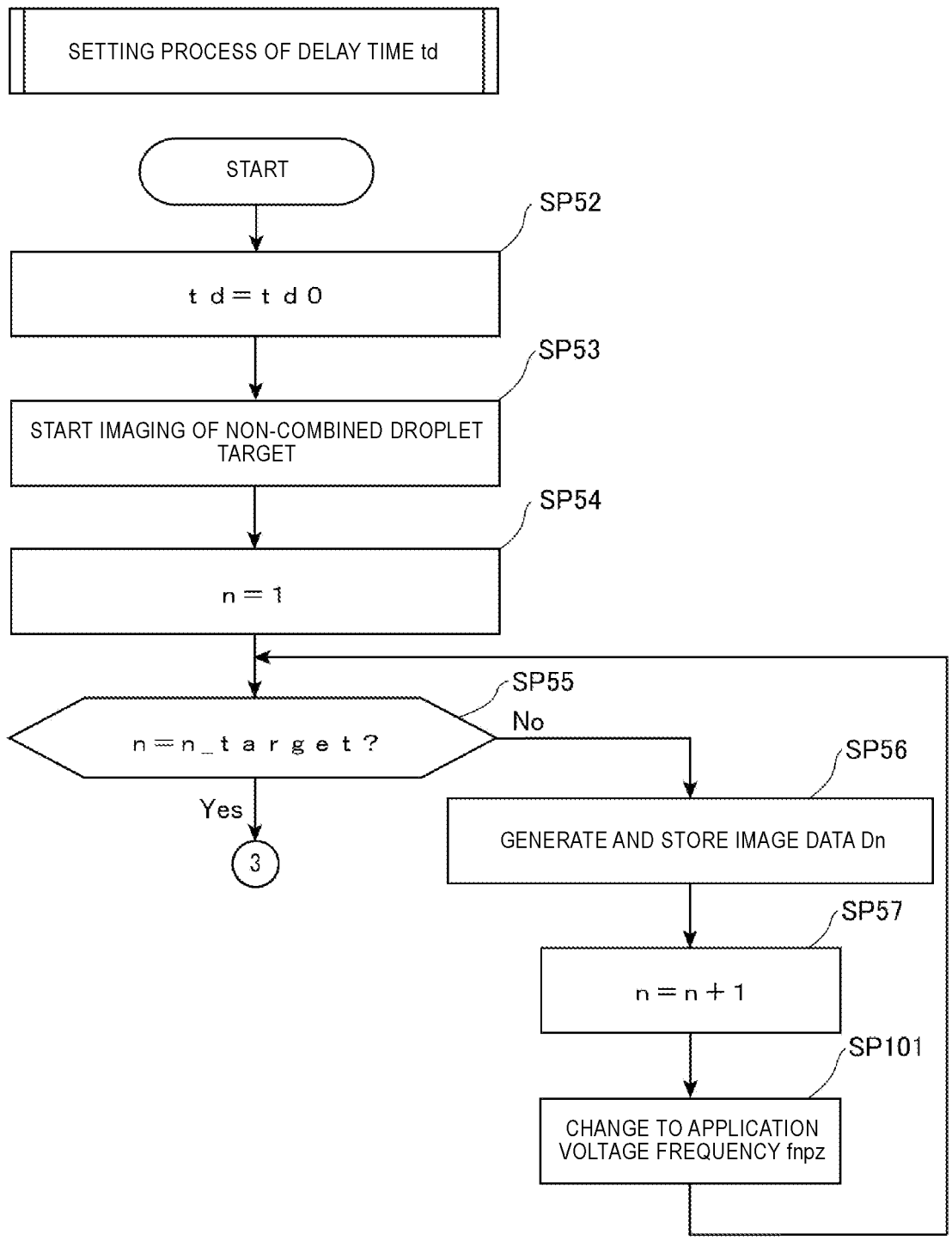

EXTREME ULTRAVIOLET LIGHT GENERATION APPARATUS AND ELECTRONIC DEVICE MANUFACTURING METHOD

CROSS-REFERENCE TO RELATED APPLICATIONS

The present application claims the benefit of Japanese Patent Application No. 2022-166045, filed on Oct. 17, 2022, the entire contents of which are hereby incorporated by reference.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

PATENT DOCUMENTS

List of Documents

Patent Document 1: U.S. Pat. No. 9,949,354
Patent Document 2: U.S. patent Ser. No. 10/141,186

SUMMARY

An extreme ultraviolet light generation apparatus according to an aspect of the present disclosure may include a target supply unit including a tank configured to store a target substance, a pressure regulator configured to regulate pressure in the tank, a nozzle configured to output the target substance from the tank, a vibrating element configured to apply vibration to the target substance to be output from the tank to generate a droplet target of the target substance; a target passage detection device configured to detect passage of the droplet target, at a first detection position, supplied from the target supply unit into a chamber and output a passage timing signal at each time of the detection; a delay circuit configured to receive the passage timing signal and output a light emission trigger signal and an imaging trigger signal at a timing delayed by a delay time from the reception of the passage timing signal; a laser device configured to generate extreme ultraviolet light by irradiating, with light, the droplet target at a second detection position on a downstream side from the first detection position in a travel direction of the droplet target each time the light trigger emission signal is input; a target image capturing device configured to image the droplet target located in a region including the second detection position each time the imaging trigger signal is input and generate image data of the region and the droplet target located in the region; and a processor. Here, the processor is configured to control the vibrating element to provide irregular intervals between the droplet targets adjacent to each other; generate integrated image data by integrating plural pieces of the image data imaged at different times; specify a position, in the integrated image data, of the droplet target most emphasized in the integrated image data; and set the delay time based on a distance from the position of the most emphasized droplet target to the second detection position.

An electronic device manufacturing method according to an aspect of the present disclosure may include outputting extreme ultraviolet light generated using an extreme ultraviolet light generation apparatus to an exposure apparatus, and exposing a photosensitive substrate to the extreme ultraviolet light in the exposure apparatus to manufacture an electronic device. Here, the extreme ultraviolet light generation apparatus includes a target supply unit including a tank configured to store a target substance, a pressure regulator configured to regulate pressure in the tank, a nozzle configured to output the target substance from the tank, a vibrating element configured to apply vibration to the target substance to be output from the tank to generate a droplet target of the target substance; a target passage detection device configured to detect passage of the droplet target, at a first detection position, supplied from the target supply unit into a chamber and output a passage timing signal at each time of the detection; a delay circuit configured to receive the passage timing signal and output a light emission trigger signal and an imaging trigger signal at a timing delayed by a delay time from the reception of the passage timing signal; a laser device configured to generate the extreme ultraviolet light by irradiating, with light, the droplet target at a second detection position on a downstream side from the first detection position in a travel direction of the droplet target each time the light trigger emission signal is input; a target image capturing device configured to image the droplet target located in a region including the second detection position each time the imaging trigger signal is input and generate image data of the region and the droplet target located in the region; and a processor. The processor is configured to control the vibrating element to provide irregular intervals between the droplet targets adjacent to each other; generate integrated image data by integrating plural pieces of the image data imaged at different times; specify a position, in the integrated image data, of the droplet target most emphasized in the integrated image data; and set the delay time based on a distance from the position of the most emphasized droplet target to the second detection position.

An electronic device manufacturing method according to an aspect of the present disclosure may include inspecting a defect of a mask by irradiating the mask with extreme ultraviolet light generated using an extreme ultraviolet light generation apparatus, selecting a mask using a result of the inspection, and exposing and transferring a pattern formed on the selected mask onto a photosensitive substrate. Here, the extreme ultraviolet light generation apparatus includes a target supply unit including a tank configured to store a target substance, a pressure regulator configured to regulate pressure in the tank, a nozzle configured to output the target substance from the tank, a vibrating element configured to apply vibration to the target substance to be output from the tank to generate a droplet target of the target substance; a target passage detection device configured to detect passage of the droplet target, at a first detection position, supplied from the target supply unit into a chamber and output a passage timing signal at each time of the detection; a delay circuit configured to receive the passage timing signal and output a light emission trigger signal and an imaging trigger signal at a timing delayed by a delay time from the reception of the passage timing signal; a laser device configured to generate the extreme ultraviolet light by irradiating, with light, the droplet target at a second detection position on a downstream side from the first detection position in a travel direction of the droplet target each time the light trigger emission signal is input; a target image capturing device configured to image the droplet target located in a region including the second detection position each time the imaging trigger signal is input and generate image data of the region and the droplet target located in the region; and a processor. The processor is configured to control the vibrating element to provide irregular intervals between the droplet targets adjacent to each other; generate integrated image data by integrating plural pieces of the image data imaged at different times; specify a position, in the integrated image data, of the droplet target most emphasized in the integrated image data; and set the delay time based on a distance from the position of the most emphasized droplet target to the second detection position.

BRIEF DESCRIPTION OF THE DRAWINGS

Embodiments of the present disclosure will be described below merely as examples with reference to the accompanying drawings.

FIG. 15 is a diagram showing the relationship between a number of imaging times and an application voltage frequency.

FIG. 16 is a part of the control flowchart in the delay time setting process of the second embodiment.

DESCRIPTION OF EMBODIMENTS

Figure 1:
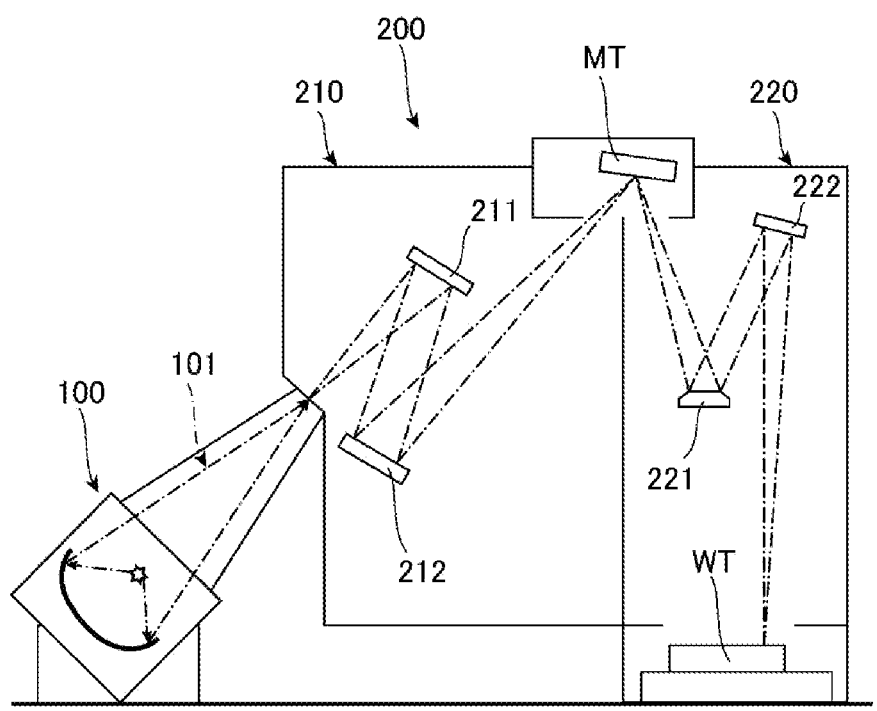
FIG. 1 is a schematic view showing a schematic configuration example of an entire electronic device manufacturing apparatus.

1. Overview
2. Description of electronic device manufacturing apparatus
3. Description of extreme ultraviolet light generation apparatus of comparative example
  3.1 Configuration
  3.2 Operation
  3.3 Problem
4. Description of extreme ultraviolet light generation apparatus of first embodiment
  4.1 Configuration
  4.2 Operation
  4.3 Effect
5. Description of extreme ultraviolet light generation apparatus of second embodiment
  5.1 Configuration
  5.2 Operation
  5.3 Effect Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overview

Embodiments of the present disclosure relate to an extreme ultraviolet light generation apparatus generating light having a wavelength of extreme ultraviolet (EUV) and an electronic device manufacturing apparatus. In the following, extreme ultraviolet light is referred to as EUV light in some cases.

2. Description of Electronic Device Manufacturing Apparatus

FIG. 1 is a schematic view showing a schematic configuration example of an entire electronic device manufacturing apparatus. The electronic device manufacturing apparatus shown in FIG. 1 includes an EUV light generation apparatus 100 and an exposure apparatus 200. The exposure apparatus 200 includes a mask irradiation unit 210 including a plurality of mirrors 211, 212 that constitute a reflection optical system, and a workpiece irradiation unit 220 including a plurality of mirrors 221, 222 that constitute a reflection optical system different from the reflection optical system of the mask irradiation unit 210. The mask irradiation unit 210 illuminates, via the mirrors 211, 212, a mask pattern of a mask table MT with EUV light 101 incident from the EUV light generation apparatus 100. The workpiece irradiation unit 220 images the EUV light 101 reflected by the mask table MT onto a workpiece (not shown) arranged on a workpiece table WT via the mirrors 221, 222. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

Figure 2:
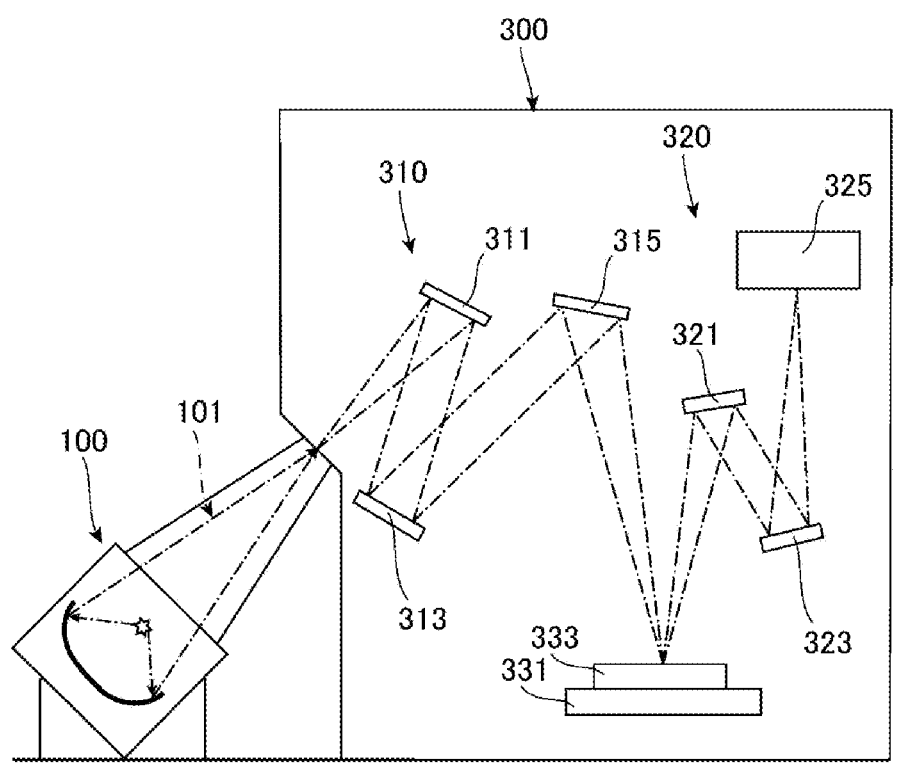
FIG. 2 is a schematic view showing a schematic configuration example of an inspection apparatus connected to an extreme ultraviolet light generation apparatus.

FIG. 2 is a schematic diagram showing an overall schematic configuration example of an inspection apparatus 300 connected to the EUV light generation apparatus 100. The inspection apparatus 300 includes an illumination optical system 310 including a plurality of mirrors 311, 313, 315 that constitute a reflection optical system, and a detection optical system 320 including a detector 325 and a plurality of mirrors 321, 322 that constitute a reflection optical system different from the reflection optical system of the illumination optical system 310. The illumination optical system 310 reflects, with the mirrors 311, 313, 315, the EUV light 101 incident from the EUV light generation apparatus 100 to illuminate a mask 333 placed on a mask stage 331. The mask 333 includes a mask blanks before a pattern is formed. The detection optical system 320 reflects, with the mirrors 321, 323, the EUV light 101 reflecting the pattern from the mask 333 and forms an image on a light receiving surface of the detector 325. The detector 325 having received the EUV light 101 obtains an image of the mask 333. The detector 325 is, for example, a time delay integration (TDI) camera. A defect of the mask 333 is inspected based on the image of the mask 333 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 200.

3. Description of Extreme Ultraviolet Light Generation Apparatus of Comparative Example 3.1 Configuration The EUV light generation apparatus 100 of a comparative example will be described. The comparative example of the present disclosure is an example recognized by the applicant as known only by the applicant, and is not a publicly known example admitted by the applicant. Further, the following description will be given with reference to the EUV light generation apparatus 100 that outputs the EUV light 101 to the exposure apparatus 200 as an external apparatus as shown in FIG. 1. Here, the EUV light generation apparatus 100 that outputs the EUV light 101 toward the inspection apparatus 300 as an external apparatus as shown in FIG. 2 can also obtain the same operation and effect.

Figure 3:
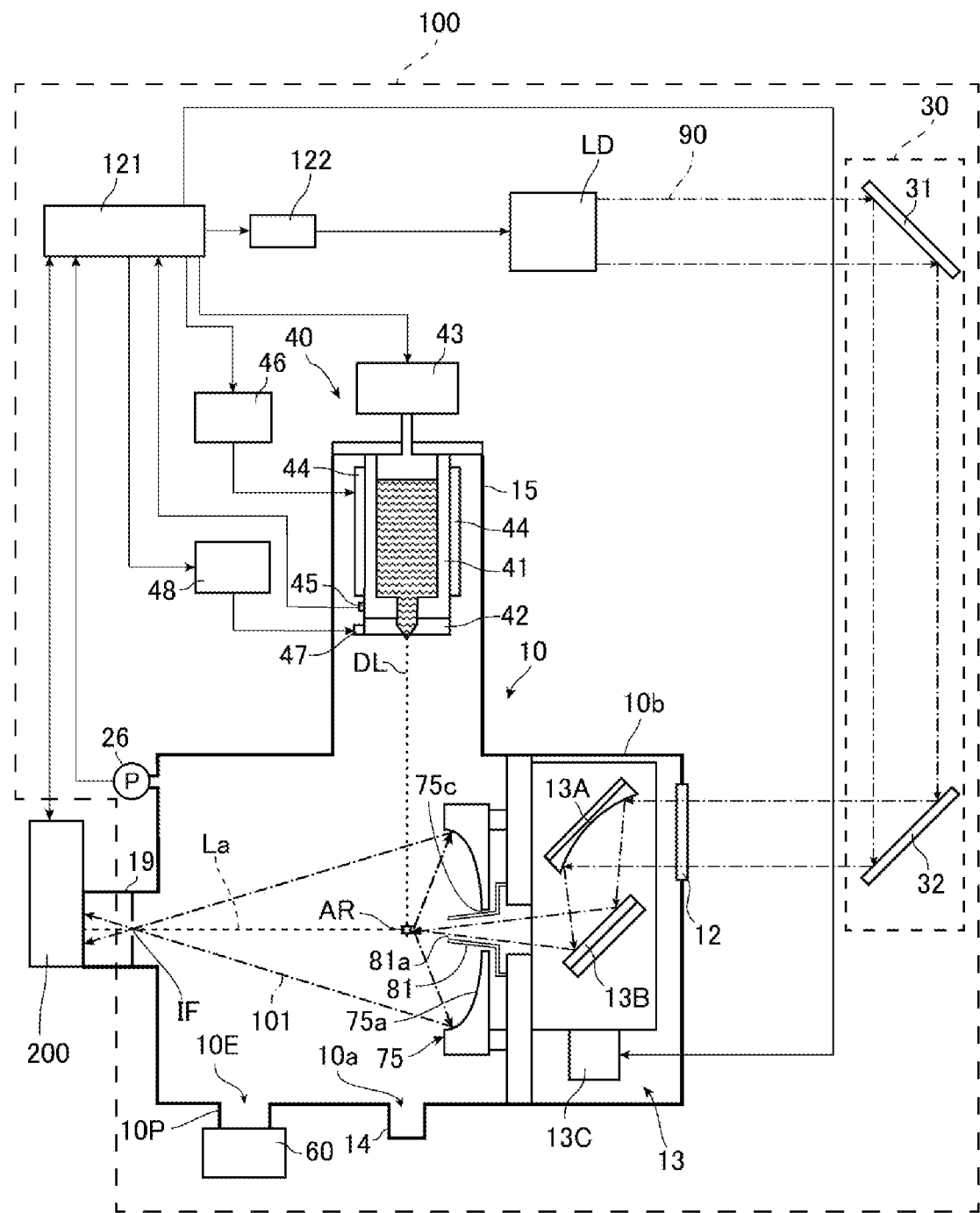
FIG. 3 is a schematic view showing a schematic configuration example of the entire extreme ultraviolet light generation apparatus of a comparative example.

FIG. 3 is a schematic diagram showing a schematic configuration example of the entire EUV light generation apparatus 100 of the present example. As shown in FIG. 3, the EUV light generation apparatus 100 includes a chamber 10, a laser device LD, a laser light delivery optical system 30, a processor 121, and a delay circuit 122 as a main configuration.

The chamber 10 is a sealable container. The chamber 10 includes an inner wall 10b surrounding the internal space having a low pressure atmosphere. The chamber 10 also includes a sub-chamber 15. A target supply unit 40 is attached to the sub-chamber 15 to penetrate a wall of the sub-chamber 15. The target supply unit 40 includes a tank 41, a nozzle 42, and a pressure regulator 43 to supply a droplet target DL to the internal space of the chamber 10. The droplet target DL is sometimes abbreviated as a droplet or a target.

The tank 41 stores therein a target substance which becomes the droplet target DL. The target substance contains tin. The interior of the tank 41 is in communication with the pressure regulator 43 which regulates the pressure in the tank 41 constant. A heater 44 and a temperature sensor 45 are attached to the tank 41. The heater 44 heats the tank 41 with current applied from a heater power source 46. Through the heating, the target substance in the tank 41 melts. The temperature sensor 45 measures, via the tank 41, the temperature of the target substance in the tank 41. The pressure regulator 43, the temperature sensor 45, and the heater power source 46 are electrically connected to the processor 121.

The nozzle 42 is attached to the tank 41 and outputs the target substance. A piezoelectric element 47 serving as a vibrating element is attached to the nozzle 42. The piezoelectric element 47 is electrically connected to a piezoelectric power source 48 and is driven by voltage applied from the piezoelectric power source 48. The piezoelectric power source 48 is electrically connected to the processor 121. The piezoelectric element 47 applies vibration to the target substance to be output from the nozzle 42 to generate droplet targets DL of the target substance.

The chamber 10 includes a target collection unit 14. The target collection unit 14 is a box body attached to an inner wall 10b of the chamber 10 and communicates with the internal space of the chamber 10 via an opening 10a formed at the inner wall 10b of the chamber 10. The opening 10a is arranged directly below the nozzle 42. The target collection unit 14 is a drain tank to collect any unnecessary droplet target DL having passed through the opening 10a and reaching the target collection unit 14.

At least one through hole is formed in the inner wall 10b of the chamber 10. The through hole is blocked by a window 12 through which pulse laser light 90 output from the laser device LD passes.

Further, a laser light concentrating optical system 13 is arranged at the internal space of the chamber 10. The laser light concentrating optical system 13 includes a laser light concentrating mirror 13A and a high reflection mirror 13B. The laser light concentrating mirror 13A reflects and concentrates the laser light 90 having passed through the window 12. The high reflection mirror 13B reflects the laser light 90 concentrated by the laser light concentrating mirror 13A. Positions of the laser light concentrating mirror 13A and the high reflection mirror 13B are adjusted by a laser light manipulator 13C so that a concentration position of the laser light 90 at the internal space of the chamber 10 coincides with a position specified by the processor 121. The concentration position is adjusted to be a position directly below the nozzle 42, and when the target substance is irradiated with the laser light 90 at the concentration position, plasma is generated by the irradiation, and the EUV light 101 is radiated from the plasma. The region in which plasma is generated is sometimes referred to as a plasma generation region AR.

For example, an EUV light concentrating mirror 75 having a spheroidal reflection surface 75a is arranged at the internal space of the chamber 10. The reflection surface 75a reflects the EUV light 101 radiated from the plasma in the plasma generation region AR. The reflection surface 75a has a first focal point and a second focal point. The reflection surface 75a may be arranged such that, for example, the first focal point is located in the plasma generation region AR and the second focal point is located at an intermediate focal point IF. In FIG. 3, a straight line passing through the first focal point and the second focal point is shown as a focal line La. The focal line La is extended along the center axis direction of the reflection surface 75a.

Further, the EUV light generation apparatus 100 includes a connection portion 19 providing communication between the internal space of the chamber 10 and the internal space of the exposure apparatus 200. A wall in which an aperture is formed is arranged in the connection portion 19. The wall is preferably arranged such that the aperture is located at the second focal point. The connection portion 19 is an outlet port of the EUV light 101 in the EUV light generation apparatus 100, and the EUV light 101 is output from the connection portion 19 and enters the exposure apparatus 200.

Further, the EUV light generation apparatus 100 includes a pressure sensor 26. The pressure sensor 27 is attached to the chamber 10 and is electrically connected to the processor 121. The pressure sensor 26 measures the pressure at the internal space of the chamber 10 and outputs a signal indicating the pressure to the processor 121.

The processor 121 of the present disclosure is a processing device including a storage device in which a control program is stored and a central processing unit (CPU) that executes the control program. The processor 121 is specifically configured or programmed to perform various processes included in the present disclosure and controls the entire EUV light generation apparatus 100. The processor 121 receives a signal related to the pressure at the internal space of the chamber 10, which is measured by the pressure sensor 26, a burst signal instructing the burst operation from the exposure apparatus 200, and the like. The processor 121 processes the various signals, and may control, for example, the timing at which the droplet target DL is output, the output direction of the droplet target DL, and the like. Further, the processor 121 may control the output timing of the laser device LD, the travel direction and the concentration position of the laser light 90, and the like. Such various kinds of control described above are merely exemplary, and other control may be added as necessary, as described later.

The processor 121 of the present example is electrically connected to the laser device LD via the delay circuit 122. The delay circuit 122 receives a passage timing signal from a target passage detection device described later via the processor 121. The delay circuit 122 outputs a light emission trigger signal to the laser device LD at a timing delayed by a predetermined delay time from the input of the passage timing signal.

When the light emission trigger signal is input, the laser device LD outputs the laser light 90. The laser device LD includes a master oscillator being a light source to perform burst operation. The master oscillator outputs the pulse laser light 90 in a burst-on duration. The master oscillator is, for example, a laser device configured to output the laser light 90 by exciting, through electric discharge, a gas as mixture of a carbon dioxide gas with helium, nitrogen, or the like. Alternatively, the master oscillator may be a quantum cascade laser device. The master oscillator may output the pulse laser light 90 by a Q switch system. Further, the master oscillator may include an optical switch, a polarizer, and the like. In the burst operation, the pulse laser light 90 is continuously output at a predetermined repetition frequency in the burst-on duration and the output of the laser light 90 is stopped in a burst-off duration.

A travel direction of the laser light 90 output from the laser device LD is adjusted by the laser light delivery optical system 30. The laser light delivery optical system 30 includes a plurality of mirrors 31, 32 for adjusting the travel direction of the laser light 90. The position of at least one of the mirrors 31, 32 is adjusted by an actuator (not shown). Owing to that the position of at least one of the mirrors 31, 32 is adjusted, the laser light 90 can appropriately propagate to the internal space of the chamber 10 through the window 12.

A central gas supply unit 81 for supplying etching gas to the internal space of the chamber 10 is arranged at the chamber 10. As described above, since the target substance contains tin, the etching gas is, for example, a hydrogen-containing gas having hydrogen gas concentration of 100% in effect. Alternatively, the etching gas may be, for example, a balance gas having hydrogen gas concentration of approximately 3%. The balance gas contains a nitrogen ($N_2$) gas and an argon (Ar) gas. Tin fine particles and tin charged particles are generated when the target substance constituting the droplet target DL is turned into plasma in the plasma generation region AR by being irradiated with the laser light 90. Tin constituting these fine particles and charged particles reacts with hydrogen contained in the etching gas supplied to the internal space of the chamber 10. Through the reaction with hydrogen, tin becomes stannane ($SnH_4$) gas at room temperature.

The central gas supply unit 81 has a side surface shape of a circular truncated cone, and is inserted through a through hole 75c formed in the center of the EUV light concentrating mirror 75. The central gas supply unit 81 is called a cone in some cases. Further, the central gas supply unit 81 has a central gas supply port 81a being a nozzle. The central gas supply port 81a is provided on the focal line La at the reflection surface 75a. The central gas supply port 81a supplies the etching gas from the center side of the reflection surface 75a toward the plasma generation region AR. Here, it is preferable that the etching gas is supplied from the central gas supply port 81a along the focal line La in the direction away from the reflection surface 75a from the center side of the reflection surface 75a. The central gas supply port 81a is connected to a gas supply device (not shown) being a tank through a pipe (not shown) of the central gas supply unit 81 and the etching gas is supplied therefrom. The gas supply device is driven and controlled by the processor 121. A supply gas flow rate adjusting unit being a valve (not shown) may be arranged in the pipe (not shown).

The central gas supply port 81a is a gas supply port for supplying the etching gas to the internal space of the chamber 10 as well as an output port through which the laser light 90 is output to the internal space of the chamber 10. The laser light 90 travels toward the internal space of the chamber 10 through the window 12 and the central gas supply port 81a.

An exhaust port 10E is arranged at the inner wall 10b of the chamber 10. Since the exposure apparatus 200 is arranged on the focal line La, the exhaust port 10E is arranged at the inner wall 10b on the side lateral to the focal line La. The direction along the center axis of the exhaust port 10E is, for example, perpendicular to the focal line La. The exhaust port 10E is arranged on the side opposite to the reflection surface 75a with respect to the plasma generation region AR when viewed from the direction perpendicular to the focal line La. The exhaust port 10E exhausts gas at the internal space of the chamber 10. The exhaust port 10E is connected to an exhaust pipe 10P, and the exhaust pipe 10P is connected to an exhaust pump 60.

As described above, when the target substance is turned into plasma in the plasma generation region AR, the residual gas as exhaust gas is generated at the internal space of the chamber 10. The residual gas contains the fine particles and charged particles of tin generated through the plasma generation from the target substance, stannane generated through the reaction of the fine particles and charged particles of tin with the etching gas, and an unreacted etching gas. Some of the charged particles are neutralized at the internal space of the chamber 10, and the residual gas contains the neutralized charged particles as well. The residual gas is suctioned to the exhaust pump 60 through the exhaust port 10E and the exhaust pipe 10P.

Figure 4:
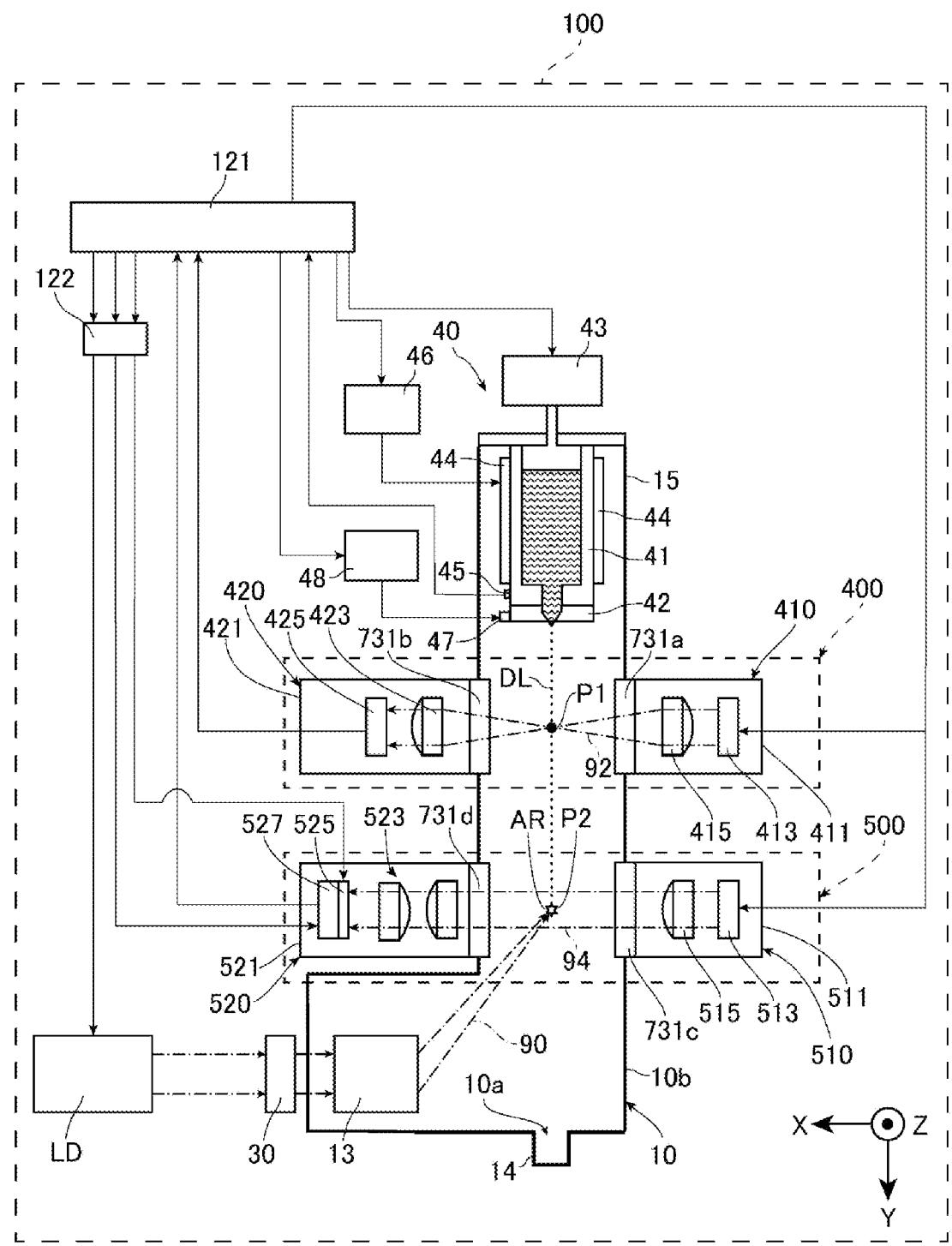
FIG. 4 is a diagram showing a target passage detection device and a target image capturing device of the extreme ultraviolet light generation apparatus of the comparative example.

FIG. 4 is a diagram showing a target passage detection device and a target image capturing device arranged in the chamber 10 of the EUV light generation apparatus 100 of the present example. In FIG. 4, some members such as the EUV light concentrating mirror 75 shown in FIG. 3 are omitted. Hereinafter, the target passage detection device may be simply referred to as a detection device 400, and the target image capturing device may be simply referred to as an imaging device 500.

The detection device 400 is arranged upstream of the imaging device 500 in the travel direction of the droplet target DL.
The detection device 400 detects the passage of the droplet target DL, and the imaging device 500 images the droplet target DL.

The detection device 400 includes an illumination unit 410 and a detection unit 420. The illumination unit 410 is arranged on the side opposite to the detection unit 420 with respect to the trajectory of the droplet target DL. The direction in which the illumination unit 410 and the detection unit 420 are arranged is perpendicular to the trajectory, but may not be perpendicular to the trajectory. The illumination unit 410 and the detection unit 420 are attached to the inner wall 10b at the outside of the chamber 10, the illumination unit 410 is arranged coaxially with the window 731a provided in the inner wall 10b, and the detection unit 420 is arranged coaxially with the window 731 provided in the inner wall 10b.

The illumination unit 410 includes a container 411, and a light source 413 and an illumination optical system 415 that are accommodated in the container 411. The light source 413 is electrically connected to the processor 121, and the emission timing of the light 92 output from the light source 413 is controlled. The light source 413 may be, for example, a light source that outputs monochromatic laser light or a lamp that outputs light including a plurality of wavelengths. The illumination optical system 415 includes a light concentrating lens and concentrates the light 92 on the trajectory of the droplet target DL via the window 731a.

The detection unit 420 includes a container 421, and a light receiving optical system 423 and an optical sensor 425 that are accommodated in the container 421. The light receiving optical system 423 includes a lens that transfers an image of the droplet target DL illuminated with the light 92 onto the optical sensor 425. The optical sensor 425 is, for example, a photodiode or the like. When the droplet target DL blocks the light 92, the amount of light 92 received by the optical sensor 425 varies. The optical sensor 425 generates the passage timing signal indicating the passage of the droplet target DL based on the variation and outputs the passage timing signal to the processor 121. Hereinafter, the detection position of the droplet target DL by the detection device 400 may be referred to as a first detection position P1. The first detection position P1 is located between the illumination unit 410 and the detection unit 420 of the detection device 400, and is a concentration position of the light 92 from the illumination unit 410 on the trajectory of the droplet target DL.

The imaging device 500 includes an illumination unit 510 and an imaging unit 520. The illumination unit 510 is arranged on the side opposite to the imaging unit 520 with respect to the trajectory of the droplet target DL. The direction in which the illumination unit 510 and the imaging unit 520 are arranged is perpendicular to the trajectory, but may not be perpendicular to the trajectory. The illumination unit 510 and the imaging unit 520 are attached to the inner wall 10b at the outside of the chamber 10, the illumination unit 510 is arranged coaxially with the window 731c provided in the inner wall 10b, and the imaging unit 520 is arranged coaxially with the window 731d provided in the inner wall 10b.

The illumination unit 510 includes a container 511, and a light source 513 and an illumination optical system 515 that are accommodated in the container 511. The light source 513 is electrically connected to the processor 121, and the emission timing of the light 94 output from the light source 513 toward the droplet target DL in the plasma generation region AR is controlled. The light source 513 is, for example, a flash lamp that emits light including a plurality of wavelengths. The illumination optical system 515 includes a collimator lens.

The imaging unit 520 includes a container 521, and an imaging optical system 523, a shutter 525, and an imaging body unit 527 that are accommodated in the container 521. The imaging optical system 523 includes a first lens and a second lens. The shutter 525 is electrically connected to the delay circuit 122. The imaging body unit 527 is, for example, a charge-coupled device (CCD) or the like, and is electrically connected to the processor 121 and the delay circuit 122. When the passage timing signal is input from the detection device 400, the processor 121 outputs an imaging trigger signal to each of the shutter 525 and the imaging body unit 527 via the delay circuit 122 with a delay of a predetermined delay time from the input of the passage timing signal. Hereinafter, the imaging trigger signal for the shutter 525 may be referred to as a shutter trigger signal, and the imaging trigger signal for the imaging body unit 527 may be referred to as an imaging trigger signal. When the shutter trigger signal is input from the delay circuit 122, the shutter 525 opens for an extremely short time and then closes. The imaging body unit 527 receives the imaging trigger signal from the delay circuit 122 and receives the light 94 while the shutter 525 is open. Then, the imaging body unit 527 generates image data by imaging the droplet target DL and outputs the image data to the processor 121 as an electric signal. Hereinafter, the detection position of the droplet target DL by the imaging device 500 may be referred to as a second detection position P2. The second detection position P2 is located on the downstream side of the first detection position P1 in the travel direction of the droplet target DL, and in the plasma generation region AR and in the illumination region of the light 94 from the illumination unit 510 on the trajectory of the droplet target DL.

In the following, a direction along the trajectory of the droplet target DL may be referred to as a Y direction, a direction in which the illumination unit 410 and the detection unit 420 are arranged and which is perpendicular to the Y direction may be referred to as an X direction, and a direction perpendicular to the Y direction and the X direction may be referred to as a Z direction. The X direction is also a direction in which the illumination unit 510 and the imaging unit 520 are arranged.

3.2 Operation

Figure 5:
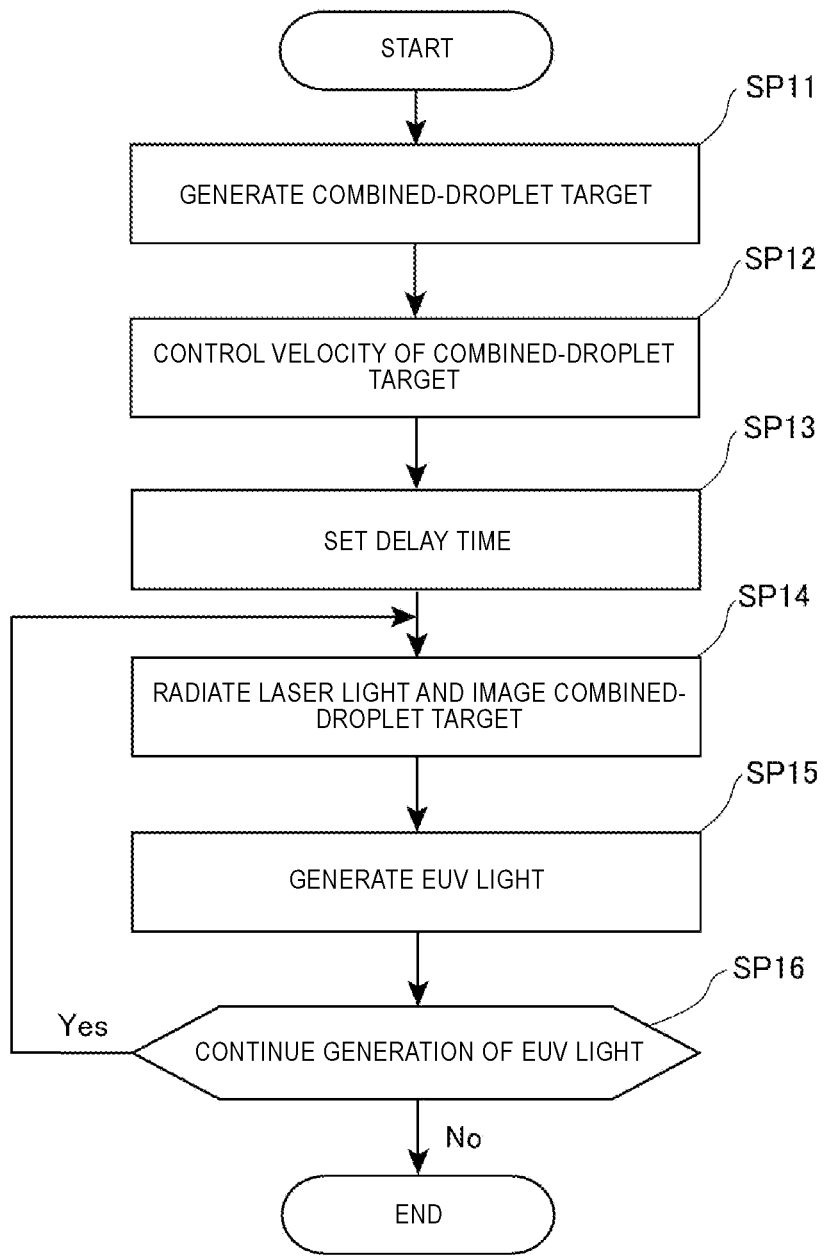
FIG. 5 is a diagram showing an example of a control flowchart of a processor of the comparative example.

Next, operation of the processor 121 of the comparative example will be described. FIG. 5 is a diagram showing an example of a control flowchart of the processor 121 according to the comparative example. This control flow includes steps SP11 to SP16. In the start state shown in FIG. 5, the processor 121 receives a drive instruction signal for the target supply unit 40 from the exposure processor of the exposure apparatus 200. In addition, in the start state, the processor 121 causes the light 92 to be output from the illumination unit 410 and the light 94 to be output from the illumination unit 510.

(Step SP11) In the present step, in order to heat and maintain the target substance in the tank 41 to and at a predetermined temperature equal to or higher than the melting point, the processor 121 causes the heater power source 46 to supply current to the heater 44 to increase temperature of the heater 44. In this case, the processor 121 controls the temperature of the target substance to the predetermined temperature by adjusting a value of the current supplied from the heater power source 46 to the heater 44 based on an output from the temperature sensor 45. When the target substance is tin, the predetermined temperature is equal to or higher than 231° C. being the melting point of tin and, for example, is 240° C. or higher and 290° C. or lower. Thus, the preparation for outputting the droplet target DL is completed.

When the preparation is completed, the processor 121 causes the pressure regulator 43 to supply the inert gas from a gas supply source (not shown) to the tank 41 and to regulate the pressure in the tank 41 so that the melted target substance is output through the nozzle hole of the nozzle 42 at a predetermined velocity. Under this pressure, the target substance is output into the chamber 10 through the nozzle hole of the nozzle 42. The target substance output through the nozzle hole may be in the form of a jet. At this time, the processor 121 causes the piezoelectric power source 48 to apply voltage having a predetermined waveform to the piezoelectric element 47 to generate the droplet target DL. The piezoelectric power source 48 applies voltage so that the waveform of the voltage value becomes, for example, a sine wave, a rectangular wave, or a sawtooth wave. Thus, the piezoelectric element 47 vibrates at a predetermined frequency. Vibration of the piezoelectric element 47 can propagate through the nozzle 42 to the target substance to be output through the nozzle hole of the nozzle 42. The target substance is divided at a predetermined cycle by the vibration and becomes droplet targets DL of liquid droplets, and an interval between adjacent droplet targets DL is substantially constant. Hereinafter, the droplet target DL having the interval between adjacent droplet targets DL substantially constant may be referred to as a combined droplet target DL. The diameter of the droplet target DL is approximately 20 µm or less. After outputting the droplet target DL, the processor 121 advances the control flow to step SP12. All of the droplet targets DL in the following steps of the present example are the combined droplet targets DL.

Prior to step SP12, the droplet target DL output from the target supply unit 40 travels to the target collection unit 14. In this course, the droplet target DL passes through the first detection position P1 of the droplet target DL by the detection device 400 and the second detection position P2 of the droplet target DL by the imaging device 500, that is, the plasma generation region AR.

When the droplet target DL passes through the first detection position P1, the droplet target DL blocks the light 92 from the light source 413 of the detection device 400. As a result, the amount of light received by the optical sensor 425 of the detection device 400 varies. The optical sensor 425 generates the passage timing signal indicating the passage of the droplet target DL based on the variation and outputs the passage timing signal to the processor 121. Each time the droplet target DL blocks the light 92, the optical sensor 425 outputs the passage timing signal.

The processor 121 performs mask processing on the plurality of input passage timing signals and recognizes only passage timing signals at predetermined time intervals among the plurality of input passage timing signals. The number of the recognized passage timing signals is plural but less than the number of the passage timing signals input to the processor 121. The droplet target DL corresponding to the recognized passage timing signal is an imaging target of the imaging device 500 and an irradiation target of the laser light 90 of the laser device LD. That is, not all of the droplet targets DL are the imaging targets and the irradiation targets, but the droplet targets DL at approximately a predetermined cycle among all of the droplet targets DL are the imaging targets and the irradiation targets. Then, the processor 121 inputs a trigger signal, which is a signal serving as a starting point of the imaging trigger signal and the light emission trigger signal, to the delay circuit 122 for each of the passage timing signals recognized after the mask processing. The trigger signal can also be understood as the passage timing signal input to the delay circuit 122 via the processor 121. Each time the trigger signal is input, the delay circuit 122 outputs the imaging trigger signal to the shutter 525 and the imaging body unit 527 and outputs the light emission trigger signal to the laser device LD at a timing delayed by a predetermined delay time from the input of the trigger signal. Therefore, it can be understood that the processor 121 outputs the imaging trigger signal and the light emission trigger signal via the delay circuit 122 with a delay of the predetermined delay time from the input of the passage timing signal recognized after the mask processing.

When the imaging trigger signal is input, the shutter 525 is opened, and the imaging body unit 527 images the droplet target DL located in a predetermined imaging region including the second detection position P2 while the shutter 525 is open. Then, the imaging body unit 527 generates image data of the imaging region and the droplet target DL located in the imaging region.

The imaging trigger signal is individually output in accordance with each of the plurality of passage timing signals recognized after the mask processing. Each time the imaging trigger signal is input, the imaging device 500 images the droplet target DL located in the imaging region including the second detection position P2 and generates the image data of the imaging region and the droplet target DL located in the imaging region. The imaging body unit 527 outputs each image data to the processor 121 as an electric signal. Since the imaging body unit 527 is driven by the imaging trigger signal, the imaging device 500 can image the droplet target DL which is detected by the detection device 400 to pass through the first detection position P1 and which becomes a measurement target through the mask processing of the processor 121.

(Step SP12) In the present step, the processor 121 calculates the velocity of the droplet target DL from the frequency of the piezoelectric element 47 and the interval between adjacent droplet targets DL. The interval between adjacent droplet targets DL is measured by the processor 121 from the image data of the droplet targets DL imaged by the imaging body unit 527. Then, the processor 121 adjusts the pressure in the tank 41 by the pressure regulator 43 so that the molten target substance is output from the nozzle hole of the nozzle 42 at the target velocity and the droplet target DL reaches the plasma generation region AR at the target velocity. That is, in the present step, the processor 121 controls the velocity of the combined droplet target DL. Accordingly, the droplet target DL is supplied from the nozzle 42 to the plasma generation region AR at a predetermined velocity and a predetermined frequency. After regulating the pressure in the tank 41, the processor 121 advances the control flow to step SP13.

(Step SP13) In the present step, the processor 121 calculates the delay time based on the velocity of the droplet target DL calculated in step SP12 and the distance from the first detection position P1 to the second detection position P2, and sets the calculated delay time in the delay circuit 122. The distance is a design distance designed in advance. After setting the delay time as a fixed value in the delay circuit 122, the processor 121 advances the control flow to step SP14.

(Step SP14) In the present step, the processor 121 individually outputs the light emission trigger signal via the delay circuit 122 in accordance with each of the passage timing signals recognized after the mask processing. Then, the light emission trigger signal is input to the laser device LD with a delay of the delay time set in the delay circuit 122 in step SP13. Each time the light emission trigger signal is input, the laser device LD outputs the laser light 90 and irradiates the droplet target DL with the laser light 90 at the second detection position P2. The laser light 90 is radiated to the droplet target DL at the second detection position P2 through the laser light delivery optical system 30 and the laser light concentrating optical system 13. This droplet target DL is the droplet target DL corresponding to the passage timing signal recognized through the mask processing. Here, the processor 121 controls the laser light manipulator 13C of the laser light concentrating optical system 13 so that the laser light 90 is concentrated in the plasma generation region AR.

Further, in the present step, as described above, the processor 121 individually outputs the imaging trigger signal via the delay circuit 122 in accordance with each of the plurality of passage timing signals recognized after the mask processing. As a result, the imaging device 500 can image, at the second detection position P2, the droplet target DL which has been detected by the detection device 400 to pass through the first detection position P1 and has become the measurement target through the mask processing of the processor 121.

After outputting the light emission trigger signal and the imaging trigger signal, the processor 121 advances the control flow to step SP15.

(Step SP15) In the present step, when the droplet target DL is irradiated with the laser light 90 in the plasma generation region AR, plasma is generated by the irradiation, and light including the EUV light 101 is generated from the plasma. Among the light including the EUV light 101 generated in the plasma generation region AR, the EUV light 101 is concentrated at the intermediate focal point IF by the EUV light concentrating mirror 75, and then, is incident on the exposure apparatus 200 from the connection portion 19.

(Step SP16) In the present step, if a stop signal is not input from the exposure apparatus 200, the processor 121 returns the control flow to step SP14 to continue the generation of the EUV light 101, and if the stop signal is input, the processor 121 ends the control flow.

Figure 6:
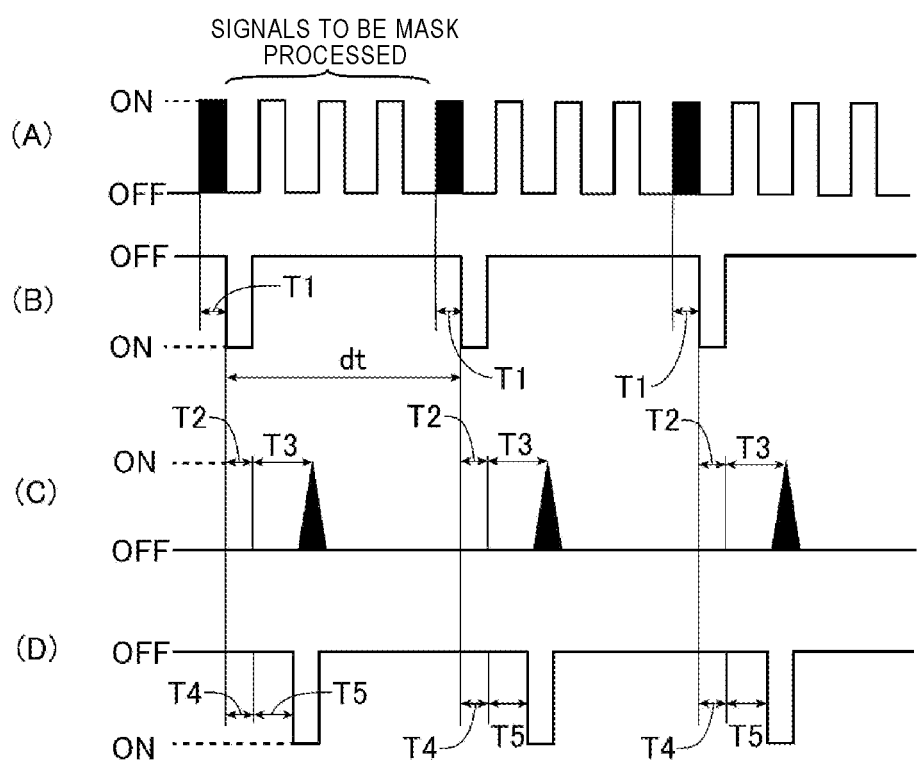
FIG. 6 is a timing chart of the control flowchart shown in FIG. 5.

FIG. 6 is a timing chart of the control flowchart shown in FIG. 5. FIG. 6(A) is a diagram corresponding to step SP11 and showing a timing chart of generating the passage timing signal. As described above, the passage timing signal is generated for each of the droplet targets DL passing through the first detection position P1. The interval of the passage timing signals is constant. The vertical axis of FIG. 6(A) indicates ON and OFF of the generation of the passage timing signal. Black portions in FIG. 6(A) are passage timing signals recognized after the mask processing, and the other portions are passage timing signals not recognized through the mask processing.

FIG. 6(B) is a diagram corresponding to step SP11 and showing a timing chart of generating the trigger signal. The trigger signal is generated based on the passage timing signal recognized through the mask processing and the time interval T1, and is the signal serving as a starting point of the light emission trigger signal and the imaging trigger signal as described above. The vertical axis of FIG. 6(B) indicates ON and OFF of the generation of the trigger signal. In FIG. 6(B), the time interval T1 indicates the delay time of the trigger signal generated in synchronization with the passage timing signal, and a time interval indicates a time interval of the trigger signals, that is, a time interval of the combined droplet targets DL corresponding to the passage timing signals recognized through the mask processing.

FIG. 6(C) is a diagram corresponding to step SP14 and is a diagram showing a timing chart of the light emission trigger signal when the laser device LD irradiates the droplet target DL having reached the second detection position P2 with the laser light 90. In FIG. 6(C), T2 and T3 indicate the time interval from the input of the trigger signal to the laser device LD to the irradiation of the droplet target DL with the laser light 90. That is, after the time interval T2, the laser light 90 travels from the laser device LD to the plasma generation region AR over a period of time indicated by T3 and having a fixed value and is radiated to the droplet target DL. Note that the time interval T2 is a time interval after the delay time T1, and is set to a value calculated in accordance with the length of T3 which is a fixed value so that the droplet target DL is irradiated with the laser light 90. The vertical axis of FIG. 6(C) indicates ON and OFF of the light emission trigger signal.

FIG. 6(D) is a diagram corresponding to step SP14 and is a diagram showing a timing chart of the imaging trigger signal when the imaging device 500 images the droplet target DL having reached the second detection position P2. The vertical axis of FIG. 6(D) indicates ON and OFF of the imaging trigger signal. In FIG. 6(D), T4 and T5 indicate a time interval from the input of the trigger signal to the imaging device 500 to imaging of the light 94. That is, after the time interval T4, the light 94 reaches the imaging body unit 527 from the light source 513 over a period of time indicated by T5 and having a fixed value. Note that the time interval T4 is a time interval after the delay time T1, and is set to a value calculated in accordance with the length of T5 which is a fixed value so that the droplet target DL is imaged at a desired timing.

3.3 Problem

In the EUV light generation apparatus 100 of the comparative example, the delay time is calculated based on the velocity of the droplet target DL and the distance from the first detection position P1 to the second detection position P2, as described in step SP13. This distance is preferably a measurement distance actually measured after the detection device 400 and the imaging device 500 are installed in the chamber 10. However, since it is not easy to perform the measurement after the installation, a design distance designed in advance is used. That is, the delay time is calculated based on the velocity of the droplet target DL and the design distance from the first detection position P1 to the second detection position P2. When the EUV light generation apparatus 100 is assembled, the detection device 400 and the imaging device 500 may be deviated from preset installation positions in the chamber 10. Therefore, there may be a case that the distance from the first detection position P1 to the second detection position P2 is different from the design distance. In this case, the delay time may not be accurately calculated. As a result, there may be a case that the droplet target DL different from the droplet target DL assumed in advance is irradiated with the laser light 90. Further, since the velocity of the droplet target DL slightly varies, even when the assumed droplet target DL is irradiated with the laser light 90, the irradiation position on the droplet target DL may be deviated. As a result, the EUV light 101 that satisfies the performance required by the exposure apparatus 200 or the inspection apparatus 300 may not be output, and the reliability of the EUV light generation apparatus 100 may decrease.

Therefore, in each of the following embodiments, the EUV light generation apparatus 100 capable of suppressing a decrease in reliability will be exemplified.

4. Description of Extreme Ultraviolet Light Generation Apparatus of First Embodiment Next, the EUV light generation apparatus 100 of a first embodiment will be described. Any component same as that described above is denoted by an identical reference sign, and duplicate description thereof is omitted unless specific description is needed.

4.1 Configuration

The configuration of the EUV light generation apparatus 100 of the present embodiment is similar to the configuration of the EUV light generation apparatus 100 of the comparative embodiment, and therefore description thereof is omitted.

4.2 Operation

Figure 7:
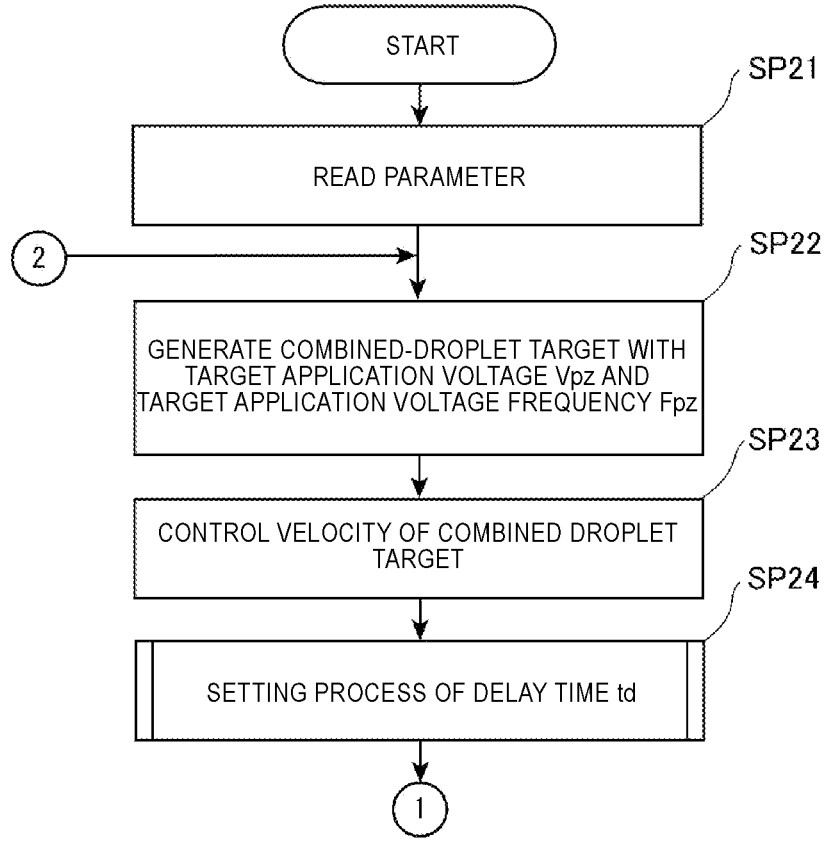
FIG. 7 is a diagram showing a part of a control flowchart of a processor according to a first embodiment.
Figure 8:
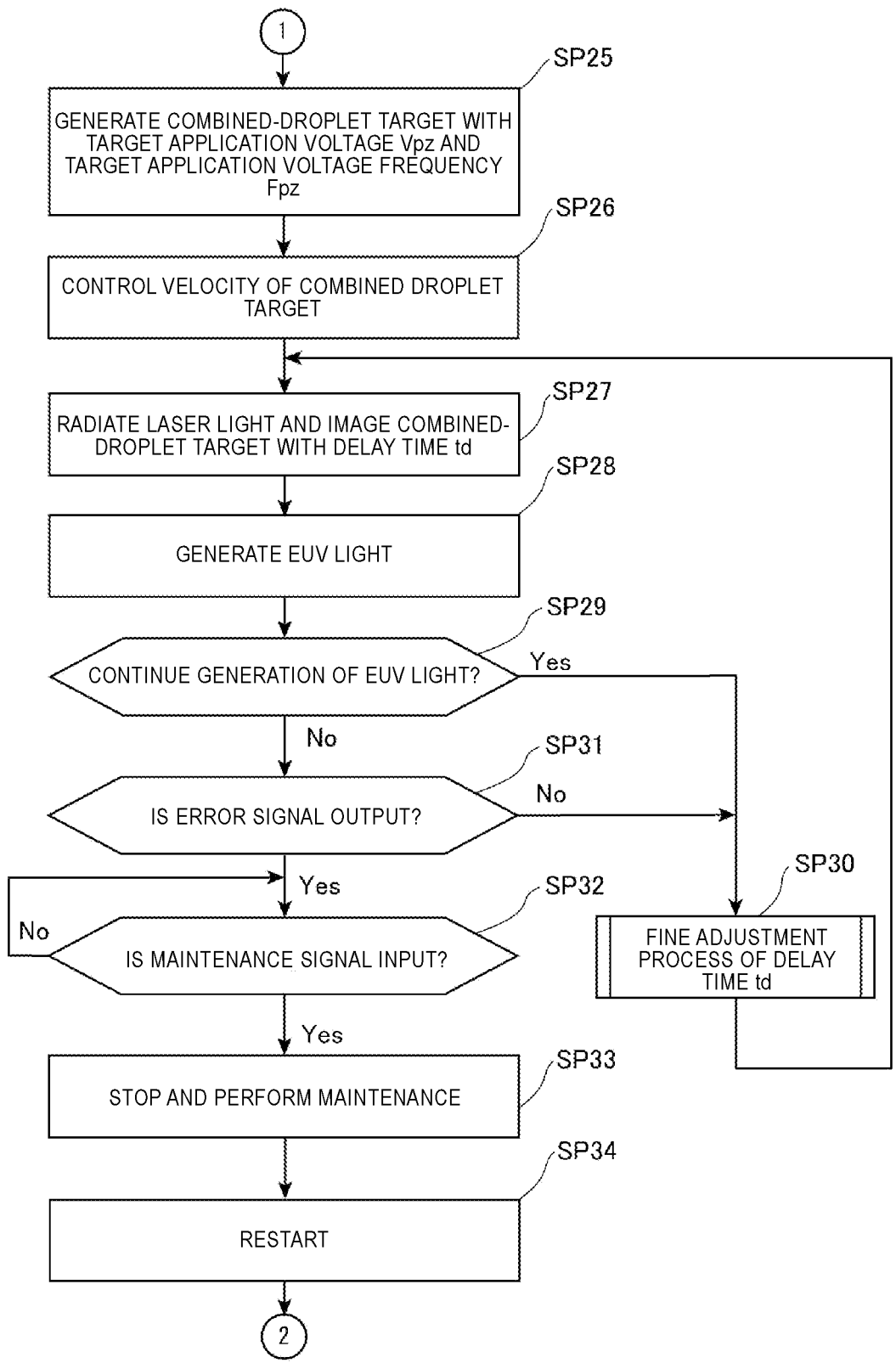
FIG. 8 is a diagram showing a remaining part of the control flowchart according to the first embodiment.

Next, operation of the processor 121 of the present embodiment will be described. FIG. 7 is a diagram showing a part of a control flowchart of the processor 121 of the present embodiment. FIG. 8 is a diagram showing a remaining part of the control flowchart. The control flowchart of the present embodiment includes steps SP21 to SP34.

In the start state shown in FIG. 7, the processor 121 receives a drive instruction signal for the target supply unit 40 from the exposure processor of the exposure apparatus 200. In addition, in the start state, the processor 121 causes the light 92 to be output from the illumination unit 410 and the light 94 to be output from the illumination unit 510. In the start state, similarly to the comparative example, the processor 121 completes preparation for outputting the droplet target DL, such as melting the target substance in the tank 41.

(Step SP21) The steps from the present step to step SP24 are preparation steps prior to the full operation of the EUV light generation apparatus 100. In the present step, the processor 121 reads parameters from the storage device. The parameters of the present embodiment include a target application voltage Vpz of the piezoelectric element 47, a target application voltage frequency Fpz of the piezoelectric element 47, a design delay time td0, a target number n_target with respect to the number of imaging times n of the non-combined droplet target DL to be described later, a threshold d_limit, and a width L of an observation region in an imaging region of the imaging body unit 527.

The target application voltage Vpz is a voltage at which the combined droplet target DL is output by the vibration of the piezoelectric element 47 to which the voltage is applied. The design delay time td0 is a time calculated from the design distance between the first detection position P1 and the second detection position P2 and the design velocity of the combined droplet target DL. The design velocity of the combined droplet target DL is calculated in advance by the nozzle hole of the nozzle 42 and the back pressure to the target supply unit 40, that is, the pressure in the tank 41 adjusted by the pressure regulator 43. The target number n_target is equal to or more than 2 and is used in step SP24, which is an adjustment process of a delay time td described later. The threshold d_limit and the width L of the observation region are used in step SP30, which is a fine adjustment process of the delay time td described later. The threshold d_limit is a threshold of the distance from the second detection position P2 to the combined droplet target DL. The observation region includes the second detection position P2, and the width L of the observation region is a length in the Y direction along the trajectory of the droplet target DL, and is set to a size at which one combined droplet target DL exists in the vicinity of the second detection position P2 in the observation region. After reading the various parameters, the processor 121 advances the control flow to step SP22.

(Step SP22) In the present step, similarly to step SP11, the processor 121 controls the pressure regulator 43 to regulate the pressure in the tank 41 and causes the target substance in the tank 41 to be output into the chamber 10 through the nozzle hole of the nozzle 42. At this time, unlike the comparative example, the processor 121 applies the target application voltage Vpz and the target application voltage frequency Fpz from the piezoelectric power source 48 to the piezoelectric element 47 to vibrate the piezoelectric element 47. Thus, in the present step, the processor 121 drives the piezoelectric element 47 to generate and output the combined droplet target DL. That is, the interval between adjacent droplet targets DL is substantially constant. After outputting the droplet target DL as the combined droplet target DL, the processor 121 advances the control flow to step SP23.

Prior to step SP23, when the droplet target DL passes through the first detection position P1, the detection device 400 outputs the passage timing signal as an electric signal to the processor 121, as in the comparative example. The detection device 400 outputs the passage timing signal for each of the droplet targets DL passing through the first detection position P1. The processor 121 performs the mask processing on the plurality of input passage timing signals and recognizes only specific passage timing signals. Further, the processor 121 outputs the imaging trigger signal to each of the shutter 525 and the imaging body unit 527 via the delay circuit 122 with a delay of the sum of the design delay time td0 and the time interval T4 from the input of the passage timing signal recognized after the mask processing. As a result, the shutter 525 is opened further after the time interval T5, and the imaging body unit 527 images the droplet target DL located in the imaging region including the second detection position P2. Then, the imaging body unit 527 generates image data of the imaging region and the droplet target DL located in the imaging region. The imaging body unit 527 outputs the generated image data as an electric signal to the processor 121. Further, the processor 121 also outputs the imaging trigger signal individually in accordance with each of the plurality of passage timing signals recognized after the mask processing. Thus, each time the imaging trigger signal is input, the imaging body unit 527 performs imaging and generates and outputs the image data.

(Step SP23) In the present step, similarly to step SP12, the processor 121 calculates the velocity DLv of the combined droplet target DL from the target application voltage frequency Fpz being the frequency of the piezoelectric element 47 and the interval between the combined droplet targets DL, and controls the velocity DLv of the combined droplet target DL. Then, the processor 121 advances the control flow to step SP24.

(Step SP24) In the present step, the processor 121 proceeds to the setting process of the delay time td described later. In the setting process of the delay time td, the delay time td corresponding to the delay time T1 described in the comparative example is set, and after the setting process of the delay time td is completed, the processor 121 advances the control flow to step SP25 shown in FIG. 8.

Next, steps SP25 to SP34 will be described with reference to FIG. 8. Step SP25 and the subsequent steps are steps for the full operation of the EUV light generation apparatus 100.

(Step SP25) In the present step, similarly to step SP22, the processor 121 applies the target application voltage Vpz and the target application voltage frequency Fpz to the piezoelectric element 47 to generate and output the droplet target DL as the combined droplet target DL. After outputting the droplet target DL, the processor 121 advances the control flow to step SP26.

Here, when the droplet target DL passes through the first detection position P1, the detection device 400 outputs the passage timing signal to the processor 121, as in the comparative example. The detection device 400 outputs the passage timing signal for each of the droplet targets DL passing through the first detection position P1. The processor 121 performs the mask processing on the plurality of input passage timing signals and recognizes only specific passage timing signals. Further, the processor 121 outputs the imaging trigger signal to each of the shutter 525 and the imaging body unit 527 via the delay circuit 122 with a delay of the sum of the delay time td and the time interval T4 from the input of the passage timing signal recognized after the mask processing. Each time the imaging trigger signal is input, the imaging body unit 527 performs imaging further after the time interval T5 and generates and outputs the image data.

(Step SP26) In the present step, similarly to step SP23, the processor 121 calculates the velocity DLv of the droplet target DL from the target application voltage frequency Fpz being the frequency of the piezoelectric element 47 and the interval between the droplet targets DL, and controls the velocity DLv of the combined droplet target DL. Then, the processor 121 advances the control flow to step SP27.

(Step SP27) In the present step, the processor 121 outputs the light emission trigger signal to the laser device LD via the delay circuit 122. According to the delay time td set in step SP24, the light emission trigger signal is input to the laser device LD with a delay of the sum of the delay time td and the time interval T2 from the input of the passage timing signal to the processor 121. When the light emission trigger signal is input, the laser device LD outputs the laser light 90 further after the time interval T3. The laser light 90 is radiated to the droplet target DL at the plasma generation region AR through the laser light delivery optical system 30 and the laser light concentrating optical system 13.

Further, in the present step, when the passage timing signal is input from the detection device 400, the processor 121 outputs the imaging trigger signal to each of the shutter 525 and the imaging body unit 527 via the delay circuit 122 with a delay of the sum of the delay time td and the time interval 14 from the input of the passage timing signal. As a result, further after the time interval T5, the imaging device 500 can image the combined droplet target DL which has been detected by the detection device 400 to pass through the first detection position P1 and has become the measurement target through the mask processing of the processor 121.

After outputting the light emission trigger signal and the imaging trigger signal, the processor 121 advances the control flow to step SP28.

(Step SP28) In the present step, similarly to step SP15, when the droplet target DL is irradiated with the laser light 90 in the plasma generation region AR, light including the EUV light 101 is emitted. The EUV light 101 is concentrated at the intermediate focal point IF by the EUV light concentrating mirror 75, and then, enters the exposure apparatus 200 from the connection portion 19.

Step SP29 to SP34 are steps in which the EUV light generation apparatus 100 performs the full operation based on the EUV output signal from the exposure apparatus 200.

(Step SP29) In the present step, the processor 121 advances the control flow to step SP30 to continue the generation of the EUV light 101 when the EUV light 101 is to be continuously generated, when the stop signal is not input from the exposure apparatus 200, or when the delay time td does not deviate from a predetermined value. The processor 121 advances the control flow to step SP31 to stop the generation of the EUV light 101 when the stop signal is input from the exposure apparatus 200. Further, when the EUV light 101 is not to be generated due to insufficient performance of the EUV light 101 or when the delay time td deviates from the predetermined value, the processor 121 also advances the control flow to step SP31 to cause the exposure apparatus 200 to determine whether or not it is necessary to stop the generation of the EUV light 101.

(Step SP30) In the present step, the processor 121 performs the fine adjustment process of the delay time td to be described later, and returns the control flow to step SP27.

(Step SP31) In the present step, the processor 121 advances the control flow to step SP30 when an error signal is not to be output to the exposure apparatus 200, and advances the control flow to step SP32 when the error signal is to be output to the exposure apparatus 200. The processor 121 does not output the error signal when the delay time td has a value that can be allowed by the exposure apparatus 200, and outputs the error signal when the stop signal is input from the exposure apparatus 200 or when the delay time td has a value that cannot be allowed by the exposure apparatus 200.

(Step SP32) In the present step, the processor 121 waits when the maintenance signal is not input from the exposure apparatus 200 after outputting the error signal, and advances the control flow to step SP33 when the maintenance signal is input.

(Step SP33) In the present step, the processor 121 stops the operation of the EUV light generation apparatus 100, and maintenance of the EUV light generation apparatus 100 is performed. When the maintenance of the EUV light generation apparatus 100 is finished, the control flow proceeds to step SP34.

(Step SP34) In the present step, the processor 121 restarts the EUV light generation apparatus 100 and returns the control flow to step SP22.

Figure 9:
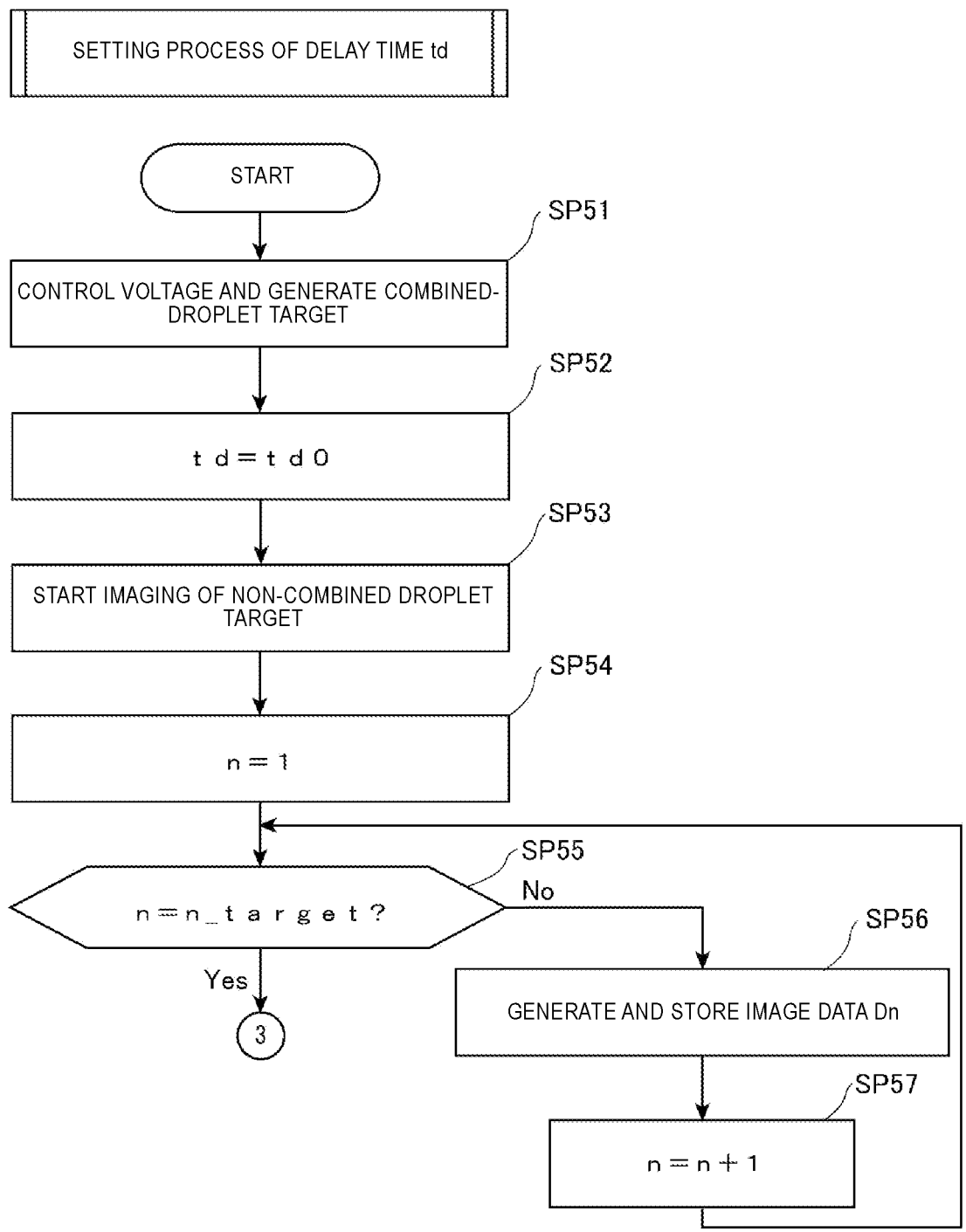
FIG. 9 is a part of the control flowchart in a delay time setting process of the first embodiment.
Figure 10:
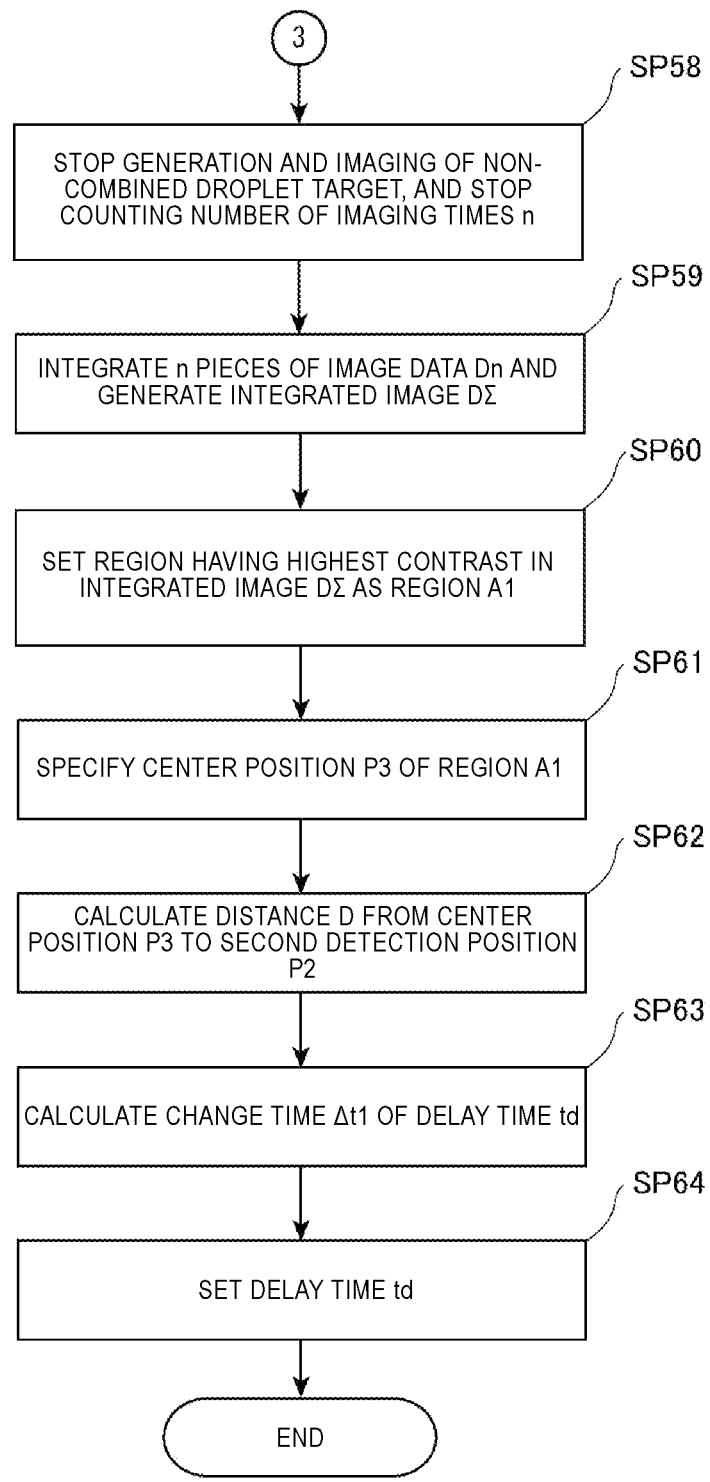
FIG. 10 is a remaining part of the control flowchart in the delay time setting process of the first embodiment.

Next, the setting process of the delay time td of the present embodiment in step SP24 will be described with reference to FIGS. 9 and 10. FIG. 9 is a part of the control flowchart of the processor 121 in the setting process of the delay time td of the present embodiment in step SP24. FIG. 10 is a remaining part of the control flowchart. The control flowchart of the present embodiment includes steps SP51 to SP64.

First, steps SP51 to SP57 will be described with reference to FIG. 9. Steps SP51 to SP57 are preparation steps prior to the full operation of the EUV light generation apparatus 100.

In the setting process of the delay time td, unlike the comparative example, the non-combined droplet target DL is used as the droplet target DL. The non-combined droplet targets DL have irregular intervals between adjacent droplet targets DL.

(Step SP51) In the present step, the processor 121 controls the voltage to be applied to the piezoelectric element 47 so that the non-combined droplet targets DL are generated. In the present embodiment, the processor 121 changes the voltage to be applied to the piezoelectric element 47 from the target application voltage Vpz described in step SP22 to 0 V. As a result, since the piezoelectric element 47 stops not to vibrate, the frequency of the piezoelectric element 47 is controlled to 0. When the droplet target DL is output in this state, the intervals between adjacent droplet targets DL are changed from the substantially constant intervals described in step SP22 to irregular intervals. Therefore, the droplet target DL is output as a non-combined droplet target DL. Since the pressure in the tank 41 is regulated by the pressure regulator 43, the velocity of the output non-combined droplet target DL is substantially constant. After outputting the droplet target DL as the non-combined droplet target DL, the processor 121 advances the control flow to step SP52.

(Step SP52) In the present step, the processor 121 sets the delay time td to the design delay time td0. The design delay time td0 in the present step is not the design delay time td0 in step SP21 but calculated from the design distance from the first detection position P1 to the second detection position P2 and the velocity DLv of the droplet target DL calculated in step SP23. After setting the delay time td to the design delay time td0, the processor 121 advances the control flow to step SP53.

Prior to step SP53, when the non-combined droplet target DL passes through the first detection position P1, the detection device 400 outputs the passage timing signal to the processor 121, as in the comparative example. The detection device 400 outputs the passage timing signal for each of the non-combined droplet targets DL passing through the first detection position P1. The processor 121 performs the mask processing on the plurality of input passage timing signals and recognizes only specific passage timing signals. The processor 121 outputs the imaging trigger signal to each of the shutter 525 and the imaging body unit 527 via the delay circuit 122 with a delay of the sum of the delay time td and the time interval T4 from the input of the passage timing signal recognized after the mask processing.

(Step SP53) In the present step, the processor 121 also outputs the imaging trigger signal individually in accordance with each of the plurality of passage timing signals recognized after the mask processing. When the first imaging trigger signal is input to the imaging body unit 527, the imaging body unit 527 starts imaging. Further, a plurality of the imaging trigger signals are input to the imaging body unit 527, and the imaging body unit 527 performs imaging each time the imaging trigger signal is input. Thus, plural pieces of the image data imaged at different times are generated. The non-combined droplet target DL located in the imaging region including the second detection position P2 is shown in this image data. When the first imaging trigger signal is input to the imaging body unit 527 and the imaging body unit 527 performs the first imaging to generate the first image, the control flow proceeds to step SP54.

(Step SP54) In the present step, when the first image data is generated as described above, the processor 121 sets the number of imaging times n of the non-combined droplet target DL to 1, starts to count the number of imaging times n, and advances the control flow to step SP55.

(Step SP55) In the present step, the processor 121 advances the control flow to step SP56 when the number of imaging times n does not reach the target number n_target described in step SP21. When the number of imaging times n reaches the target number n_target, the processor 121 advances the control flow to step SP58 shown in FIG. 10. The target number n_target is 2 or more.

(Step SP56) In the present step, the processor 121 stores, in the storage device of the processor 121, the image data generated by the imaging body unit 527 in step SP53, that is, the image data having the non-combined droplet target DL in the imaging region including the second detection position P2. The processor 121 stores the image data to be stored as the image data of the number of imaging times n. That is, when the number of imaging times n is 1, the processor 121 stores the image data as the image data of the first time, and when the current number of imaging times n is 2 or more, the processor 121 stores the sequentially generated image data in the storage device of the processor 121 as the image data of the number of imaging times n. Hereinafter, the stored image data may be referred to as image data Dn. After storing the image data Dn, the processor 121 advances the control flow to step SP57.

(Step SP57) In the present step, the processor 121 adds 1 to the number of imaging times n, and returns the control flow to step SP55.

In steps SP53 to SP57, the imaging body unit 527 performs imaging every time the imaging trigger signal is input, and plural pieces of the image data Dn are generated. Each time the image data Dn is generated, the generated image data Dn is stored in the storage device of the processor 121, and 1 is added to the number of imaging times n. Then, the processor 121 stores the image data Dn until the number of imaging times n reaches the target number n_target. That is, imaging is repeated until the number of imaging times n reaches the target number n_target, and plural pieces of image data Dn are stored in the storage device of the processor 121. The number of pieces of the image data Dn is equal to the target number n_target. Then, when the number of imaging times n reaches the target number n_target, the control flow proceeds to step SP58.

Next, steps SP58 to SP64 will be described with reference to FIG. 10. Steps SP58 to SP64 are preparation steps prior to the full operation of the EUV light generation apparatus 100.

(Step SP58) In the present step, the processor 121 stops the generation of the non-combined droplet target DL and the imaging of the non-combined droplet target DL as controlling the imaging device 500. In stopping the generation of the non-combined droplet target DL, similarly to step S22, the processor 121 adjusts the pressure in the tank 41 by the pressure regulator 43 and outputs the combined droplet target DL through the nozzle hole of the nozzle 42 into the chamber 10. Further, in the present step, the processor 121 stops counting the number of imaging times n. After the generation, imaging, and counting are stopped, the processor 121 advances the control flow to step SP59.

(Step SP59) In the present step, the processor 121 integrates n pieces of the image data Dn stored in the storage device of the processor 121 to generate integrated image data D. As described above, in the setting process of the delay time td, the same number of pieces of the image data Dn as the target number n_target are generated in steps SP53 to SP57. Hereinafter, the generation of the integrated image data DΣ will be described using a case in which the number of pieces of the image data Dn is 3.

Figure 11:
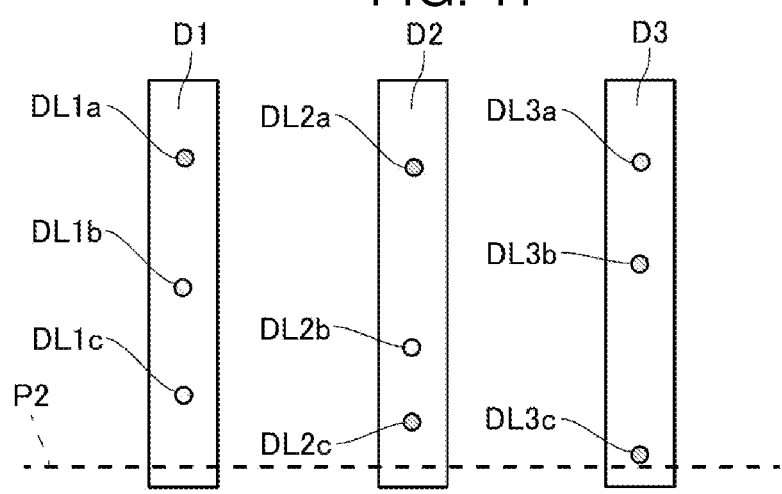
FIG. 11 is a diagram showing three pieces of generated image data.

FIG. 11 is a diagram showing three pieces of image data D1, D2, D3. The image data D1, D2, D3 are imaged at different times. In the image data D1, D2, D3, non-combined droplet targets DL1a to DL1c, DL2a to DL2c, and DL3a to Dl3c are shown in the order of the farness from the second detection position P2.

When three pieces of the image data D1, D2, D3 are compared, in each piece of the image data D1, D2, D3, non-combined droplet targets DL1a, DL2a, DL3a, which have small variation in positional deviation and are positioned substantially in a relatively fixed manner, and non-combined droplet targets DL1b, DL1c, DL2b, DL2c, DL3b, DL3c, which have large variation in positional deviation and are randomly positioned are mixed. The non-combined droplet targets DL1a, DL2a, DL3a correspond to the passage timing signal recognized through the mask processing, and are the non-combined droplet targets DL synchronized with the imaging timing of the imaging device 500. On the other hand, the non-combined droplet targets DL1b, DL1c, DL2b, DL2c, DL3b, DL3c are non-combined droplet targets DL that are asynchronous with the imaging timing of the imaging device 500. Hereinafter, the non-combined droplet targets DL1a, DL2a, DL3a may be referred to as synchronous droplet targets DL1a, DL2a, DL3a, and the non-combined droplet targets DL1b, DL1c, DL2b, DL2c, DL3b, DL3c may be referred to as asynchronous droplet targets DL1b, DL1c, DL2b, DL2c, DL3b, DL3c.

In the integration of plural pieces of the image data D1, D2, D3 in the present step, the processor 121 adds the brightness value of a certain pixel of the image data D1 and the brightness values of the respective pixels of the image data D2, D3 corresponding thereto. Further, the processor 121 performs the addition for each pixel. That is, in the integration, the processor 121 adds the brightness values of the respective pixels of the image data D1, D2, D3, and the integrated image data DΣ is image data obtained by adding the brightness values of the respective pixels of the image data D1, D2, D3. Therefore, the integrated image data DΣ is single image data in which the respective image data D1, D2, D3 are superimposed. In the integration, the processor 121 may generate the integrated image data DΣ by adding the brightness values of the pixels of the image data D1, D2, D3 and averaging the brightness values of each pixel.

Figure 12:
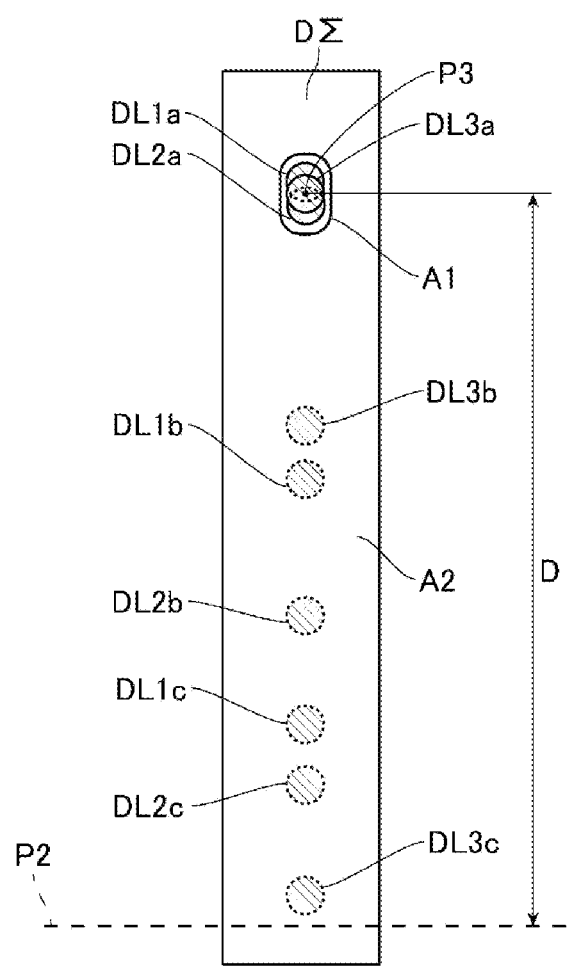
FIG. 12 is a diagram showing integrated image data.

FIG. 12 is a diagram showing the integrated image data D. In FIG. 12, the integrated image data DΣ is shown larger than the image data D1, D2, D3 shown in FIG. 11 for ease of viewing. In the integrated image DΣ, the synchronous droplet targets DL1a, DL2a, DL3a tend to overlap each other because the variation in the positional deviation is small as described above. On the other hand, the asynchronous droplet targets DL1b, DL1c, DL2b, DL2c, DL3b, DL3c tend not to overlap each other because the variation in the position deviation is large as described above. In FIG. 12, portions of the synchronous droplet targets DL1a, DL2a that overlap the synchronous droplet target DL3a are indicated by broken lines.

After generating the integrated image data DΣ, the processor 121 advances the control flow to step SP60.

(Step SP60) In the present step, the processor 121 sets, as a region A1, a region having the highest contrast, which is a difference in brightness from the region A2 in which the asynchronous droplet targets DL1b, DL1c, DL2b, DL2c, DL3b, DL3c are located, in the integrated image data DΣ.

In the integrated image data DΣ shown in FIG. 12, the region A2 is a region other than the region A1, and is a background region of the integrated image data D. The region A1 is a region where the synchronous droplet targets DL1a, DL2a, DL3a overlap each other. In FIG. 12, the region A1 is shown larger than the synchronous droplet targets DL1a, DL2a, DL3a for ease of viewing. Due to the contrast between the region A1 and the region A2, the region A1 is visually emphasized and more conspicuous than the region A2 in the integrated image data D. Since the region A1 has the highest contrast to the region A2, the region A2 is visually most emphasized and conspicuous in comparison with the region A2 in the integrated image data D.

In the image data D1, D2, D3, for example, when the non-combined droplet target DL appears visually darker, and a region other than the non-combined droplet target DL appears visually brighter than the non-combined droplet target DL, the region A1 appears visually darker in the integrated image data DΣ than the region A2. As the number of pieces of the image data Dn increases, the number of the synchronous droplet targets DL overlapping each other increases in the region A1 and thus the region A1 appears darker. Conversely to the above, for example, when the non-combined droplet target DL appears visually brighter, and an region other than the non-combined droplet target DL appears visually darker than the non-combined droplet target DL, the region A1 appears visually brighter in the integrated image data DΣ than the region A2. As the number of pieces of the image data Dn increases, the number of the synchronous droplet targets DL overlapping each other increases in the region A1 and thus the region A1 appears brighter. As described above, since the region A1 appears darker or brighter than the region A2, the region A1 is visually emphasized and conspicuous in the integrated image data D. In FIG. 12, a state in which the region A1 is conspicuous is indicated by a solid line.

In the integrated image data DΣ, the asynchronous droplet targets DL1b, DL1c, DL2b, DL2c, DL3b, DL3c are merged into the region A2, and the contrast thereof to the region A2 becomes low. Specifically, regions corresponding to the asynchronous droplet target DL1b in the image data D2, D3 correspond to the region A2 in the integrated image data D. Therefore, when the region A2 in the integrated image data DΣ is visually brighter than the region A1, the asynchronous droplet target DL1b in the integrated image data DΣ becomes brighter due to the regions corresponding to the asynchronous droplet target DL1b in the image data D2, D3. Conversely to the above, when the region A2 in the integrated image data DΣ is visually darker than the region A1, the asynchronous droplet target DL1b in the integrated image data DΣ is not brightened due to the regions corresponding to the asynchronous droplet target DL1b in the image data D2, D3. Although the above description has been made using the asynchronous droplet target DL1b, the same applies to the other asynchronous droplet targets DL1c, DL2b, DL2c, DL3b, DL3c. Therefore, the asynchronous droplet targets DL1b, DL1c, DL2b, DL2c, DL3b, DL3c are merged into the region A2, and are not visually emphasized and conspicuous in the integrated image data D. In FIG. 12, a state in which the asynchronous droplet targets DL1b, DL1c, DL2b, DL2c, DL3b, DL3c are not conspicuous is indicated by broken lines.

The number of the synchronous droplet targets DL and the number of the asynchronous droplet targets DL in the present step are not particularly limited. Therefore, when a plurality of the synchronous droplet targets DL exist in each image data D1, D2, D3, the processor 121 may set the region A1 using the synchronous droplet target DL closest to the second detection position P2.

After setting the region A1, the processor 121 advances the control flow to step SP61.

(Step SP61) In the present step, the processor 121 specifies a center position P3 of the region A1 in the Y direction. As described above, in the region A1, the synchronous droplet targets DL1a, DL2a, DL3a overlap each other. Therefore, the region A1 consists of the synchronous droplet targets DL1a, DL2a, DL3a, and can be regarded as the most emphasized synchronous droplet target in the integrated image data D. Therefore, the center position P3 is also the center position in the Y direction of the synchronous droplet targets DL1a, DL2a, DL3a overlapping each other, that is, the center position in the Y direction of the most emphasized synchronous droplet target in the integrated image data D. As described above, in the present step, the processor 121 specifies the position, in the integrated image data DΣ, of the synchronous droplet target DL consisting of the most emphasized synchronous droplet targets DL1a, DL2a, DL3a in the integrated image data D. That is, the processor 121 specifies the position of the region A1 as the position of the most emphasized synchronous droplet target. In the present step, after specifying the center position P3, the processor 121 advances the control flow to step SP62.

(Step SP62) In the present step, the processor 121 calculates a distance D from the center position P3 to the second detection position P2 in the integrated image data D. The coordinates of the second detection position P2 are specified in the integration image data D. After calculating the distance D, the processor 121 advances the control flow to step SP63.

(Step SP63) In the present step, the processor 121 calculates a change time Δt1 of the delay time td. The change time Δt1 is a value obtained by dividing the distance D calculated in step SP62 by the velocity DLv of the combined droplet target DL calculated in step SP23. After calculating the change time Δt1, the processor 121 advances the control flow to step SP64.

(Step SP64) In the present step, the processor 121 sets, as the delay time td, a value obtained by adding the change time Δt1 calculated in step SP63 to the design delay time td0 set in step SP52. That is, the processor 121 sets the delay time td by setting the change time Δt1 of the delay time based on the velocity DLv of the combined droplet target DL described in step SP63. After setting the delay time td, the processor 121 terminates the adjustment process of the delay time td, and advances the control flow to step SP25. The delay time td corresponds to the delay time T1 described in the comparative example. In step SP25, after setting the delay td, the processor 121 controls the frequency of the piezoelectric element 47 to keep the interval between adjacent droplet targets DL constant.

Figure 13:
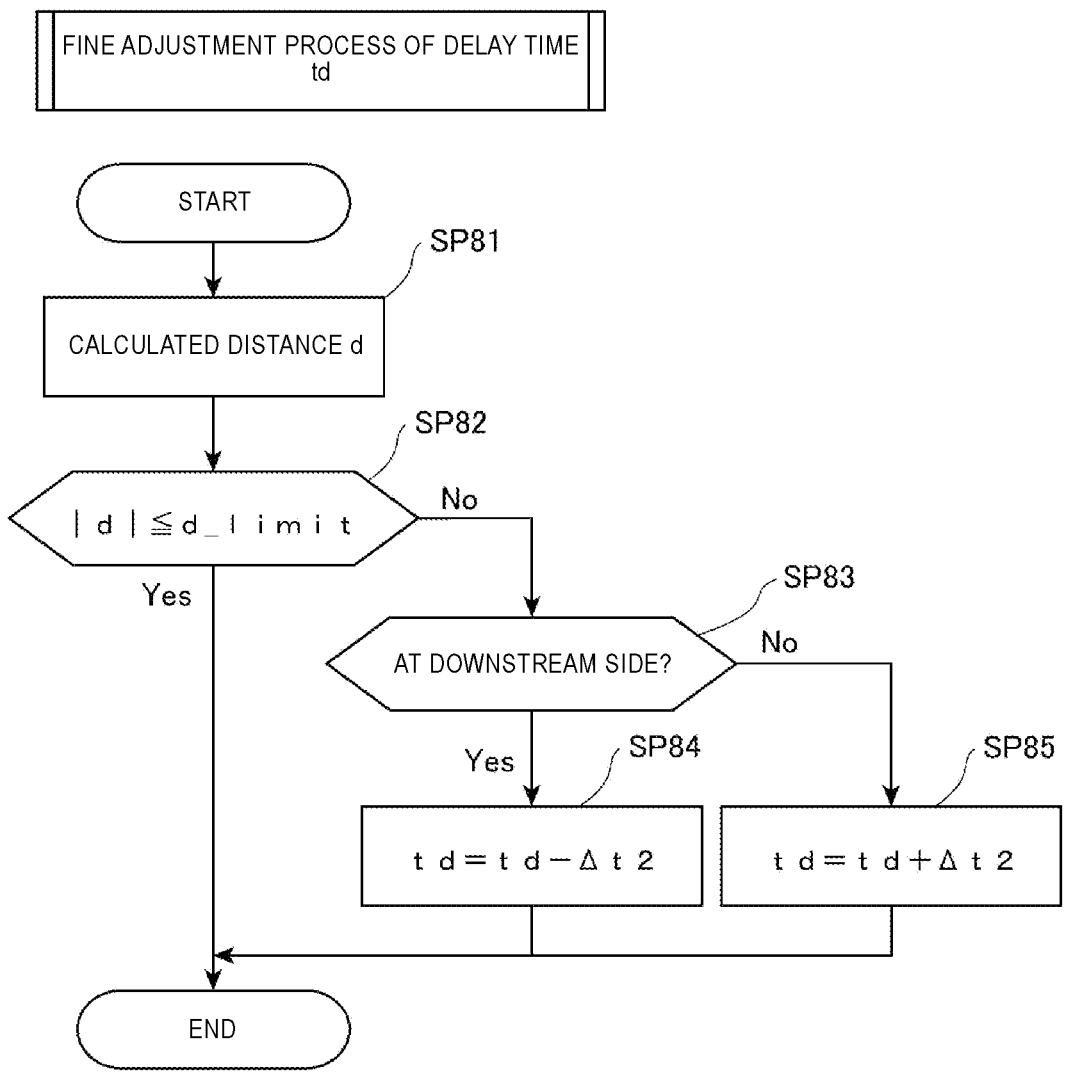
FIG. 13 is a control flowchart of a fine adjustment process of the delay time.

Next, the fine adjustment process of the delay time td in step SP30 will be described with reference to FIG. 13. FIG. 13 is a control flowchart of the processor 121 in the fine adjustment process of the delay time td. The control flowchart of the present embodiment includes steps SP81 to SP85. Even after the delay time td is set in the setting process of the delay time td in step SP24, the position of the droplet target DL may be deviated in the travel direction of the droplet target DL due to a minute variation in the velocity of the droplet target DL. In order to correct this deviation, the delay time td is finely adjusted according to the deviation in the present flowchart.

(Step SP81) In the present step, the processor 121 calculates the distance d from the second detection position P2 to the combined droplet target DL in the observation region from the image data imaged in step SP25 using the observation region described in step SP21. As described in step SP21, the width L of the observation region is set to a size at which one combined droplet target DL exists in the vicinity of the second detection position P2 in the observation region, and is longer than the distance d. The coordinates of the second detection position P2 is specified in the image data. After calculating the distance d, the processor 121 advances the control flow to step SP82.

(Step SP82) In the present step, when the absolute value of the distance d is equal to or less than the threshold d_limit described in step SP21, the processor 121 terminates the fine adjustment process of the delay time td, and returns the control flow to step SP27. When the absolute value of the distance d is more than d_limit, the processor 121 advances the control flow to step SP83.

(Step SP83) In the present step, when the combined droplet target DL is located downstream of the second detection position P2 in the travel direction of the combined droplet target DL, the processor 121 advances the control flow to step SP84. Further, when the combined droplet target DL is located upstream of the second detection position P2 in the travel direction of the combined droplet target DL, the processor 121 advances the control flow to step SP85.

(Step SP84) In the present step, the processor 121 sets, as the delay time td, a value obtained by subtracting a re-change time Δt2 of the delay time td from the delay time td, terminates the fine adjustment process of the delay time td, and returns the control flow to step SP27. The re-change time Δt2 is a time less than the change time Δt1.

(Step SP85) In the present step, the processor 121 sets, as the delay time td, a value obtained by adding the re-change time Δt2 of the delay time td to the delay time td, terminates the fine adjustment process of the delay time td, and returns the control flow to step SP27.

In steps SP84 and SP85, the processor 121 sets the re-change time Δt2 td of the delay time to be less than the change time Δt1. Therefore, after setting the delay time td in the setting process of the delay time td in step SP24, when the absolute value of the distance from the second detection position P2 to the combined droplet target DL in the imaging region is more than the threshold in step SP82, the processor 121 re-sets the delay time td based on the re-change time Δt2 of the delay time td less than the change time Δt1.

4.3 Effect

The processor 121 of the present embodiment generates the integrated image data DΣ by integrating plural pieces of the image data D1, D2, D3, specifies the position of the droplet target DL most emphasized in the integrated image data DΣ, and sets the delay time td based on the distance D from the position of the most emphasized droplet target DL to the second detection position P2. When the processor 121 sets the delay time td, the delay circuit 122 outputs the light emission trigger signal at a timing delayed by the delay time td with respect to each of the passage timing signals recognized after the mask processing. Thus, the laser light 90 can be radiated to the combined droplet target DL assumed in advance, that is, the combined droplet target DL corresponding to the passage timing signal recognized through the mask processing, and the deviation of the irradiation position on the droplet target DL can be suppressed. Therefore, even when the detection device 400 and the imaging device 500 deviate from the installation positions set in advance in the chamber 10, the irradiation with the laser light 90 to a droplet target DL different from the droplet target DL assumed in advance can be suppressed, and the deviation of the irradiation position on the combined droplet target DL assumed in advance can be suppressed. Further, even when the velocity of the droplet target DL slightly varies, the deviation of the irradiation position on the combined droplet target DL assumed in advance can be suppressed. Therefore, the laser light 90 that satisfies the performance required by the exposure apparatus 200 or the inspection apparatus 300 can be output, and a decrease in reliability of the EUV light generation apparatus 100 can be suppressed. Further, the processor 121 sets the delay time td from the integrated image data D. According to this configuration, the delay time td can be set in a shorter time than when the delay time td is set by actually measuring the distance from the first detection position P1 to the second detection position P2 after the detection device 400 and the imaging device 500 are installed in the chamber 10. Further, according to this configuration, it is not necessary to measure the distance from the first detection position P1 to the second detection position P2 after the detection device 400 and the imaging device 500 are installed in the chamber 10. Further, according to this configuration, even when the detection device 400 and the imaging device 500 are deviated from the installation positions in the chamber 10 set in advance, it is not necessary to adjust the installation positions of the detection device 400 and the imaging device 500 for the delay time td.

Further, the processor 121 controls the frequency of the piezoelectric element 47 serving as the vibrating element to 0 in step SP51. According to this configuration, since the piezoelectric element 47 does not vibrate, it is possible to generate the non-combined droplet targets DL having irregular intervals between adjacent droplet targets DL.

Further, after setting the delay time td in the setting process of the delay time td in step SP24, when the distance d from the second detection position P2 to the combined droplet target DL in the imaging region is more than the threshold d_limit in step SP82, the processor 121 re-sets the delay time td based on the re-change time $\Delta t2$ of the delay time td less than the change time $\Delta t1$. In this configuration, even when the droplet target DL is deviated from the second detection position P2 after the delay time td is changed, the delay time td is re-changed. Accordingly, it is possible to further suppress the laser light 90 from being radiated to a droplet target DL different from the droplet target DL detected by the detection device 400.

5. Description of Extreme Ultraviolet Light Generation Apparatus of Second Embodiment Next, the EUV light generation apparatus 100 of a second embodiment will be described. Any component same as that described above is denoted by an identical reference sign, and duplicate description thereof is omitted unless specific description is needed.

5.1 Configuration

The configuration of the EUV light generation apparatus 100 of the present embodiment is similar to the configuration of the EUV light generation apparatus 100 of the comparative embodiment and the first embodiment, and therefore description thereof is omitted.

5.2 Operation

Figure 14:
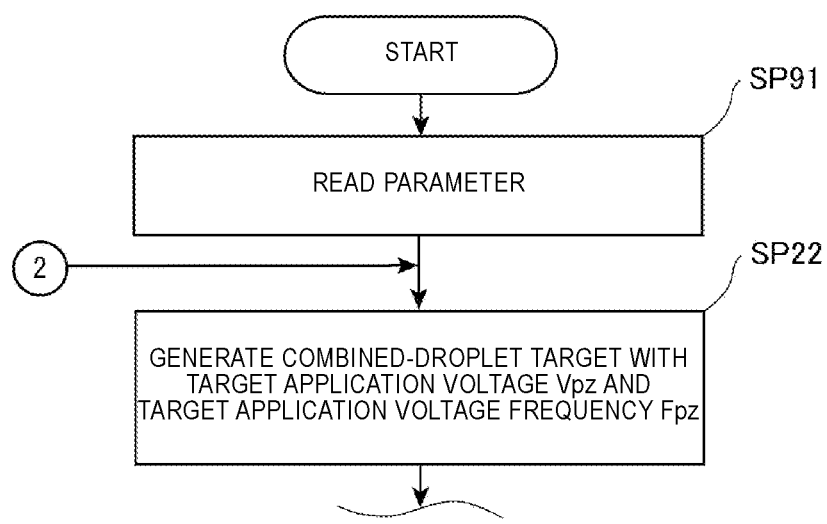
FIG. 14 is a diagram showing a part of a control flowchart of the processor according to a second embodiment.

Next, operation of the processor 121 of the present embodiment will be described. FIG. 14 is a diagram showing a part of a control flowchart of the processor 121 of the present embodiment. The control flowchart of the present embodiment differs from the control flowchart of the first embodiment in that step SP91 is included instead of step SP21. Step SP91 is a preparation step prior to the full operation of the EUV light generation apparatus 100.

The EUV light generation apparatus 100 of the first embodiment changes the voltage applied to the piezoelectric element 47 to 0 V to generate the non-combined droplet target DL. In contrast, the EUV light generation apparatus 100 of the present embodiment generates the droplet targets DL by changing the application voltage frequency of the piezoelectric element 47 to a different application voltage frequency each time the imaging body unit 527 of the imaging device 500 generates the image data. Since the interval between adjacent droplet targets DL depends on the frequency of the piezoelectric element 47, by irregularly controlling the frequency of the voltage of the piezoelectric element 47, the frequency is irregularly controlled, and the combined droplet targets DL having artificially irregular intervals are generated.

(Step SP91) In the present step, the processor 121 reads parameters from the storage device. The parameters of the present embodiment include the parameters of the first embodiment and the application voltage frequencies fnpz of the piezoelectric element 47 respectively for the number of imaging times n. FIG. 15 is a diagram showing the relationship between the number of imaging times n and the application voltage frequencies fnpz. Here, n is 2 or more. The respective application voltage frequencies fnpz may have values different from each other. Therefore, when the number of imaging times n increases, the application voltage frequency fnpz may increase, may decrease, may increase or decrease by a predetermined multiple, or may randomly vary. The application voltage frequency flpz may be the target application voltage frequency Fpz. At each of the application voltage frequencies fnpz, the combined droplet targets DL are generated. After reading the various parameters, the processor 121 advances the control flow to step SP22. Since the operation after step SP22 of the present embodiment is the same as the operation after step SP22 of the first embodiment, the explanation thereof will be omitted.

Further, in the present embodiment, the setting process of delay time td is different from that in the first embodiment. FIG. 16 is a part of the control flowchart of the processor 121 in the setting process of the delay time td of the present embodiment. The control flowchart of the present embodiment differs from the control flowchart of the first embodiment in that step SP51 is omitted and step SP101 is provided between step SP57 and step SP55.

(Step SP101) In the present step, the processor 121 changes the application voltage frequency of the piezoelectric element 47 to the application voltage frequency fnpz corresponding to the present number of imaging times n, and returns the control flow to step SP55. In steps SP53 to SP57 and step SP101, the processor 121 generates the droplet target DL by changing the application voltage frequency fnpz of the piezoelectric element 47 each time the imaging body unit 527 generates the imaging data. Then, the imaging and the change of the application voltage frequency fnpz are repeated until the number of imaging times n reaches the target number n_target.

5.3 Effect

In the EUV light generation apparatus 100 of the present embodiment, in step S101, the processor 121 changes the frequency of the piezoelectric element 47 to a different frequency each time the imaging device 500 generates the image data. The interval between adjacent droplet targets DL depends on the frequency of the piezoelectric element 47. Therefore, according to this configuration, even when the piezoelectric element 47 is driven, the combined droplet targets DL having irregular intervals between adjacent droplet targets DL can be generated.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined. The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus; comprising:
   a target supply unit including a tank configured to store a target substance, a pressure regulator configured to regulate pressure in the tank, a nozzle configured to output the target substance from the tank, a vibrating element configured to apply vibration to the target substance to be output from the tank to generate a droplet target of the target substance;
   a target passage detection device configured to detect passage of the droplet target, at a first detection position, supplied from the target supply unit into a chamber and output a passage timing signal at each time of the detection;
   a delay circuit configured to receive the passage timing signal and output a light emission trigger signal and an imaging trigger signal at a timing delayed by a delay time from the reception of the passage timing signal;
   a laser device configured to generate extreme ultraviolet light by irradiating, with light, the droplet target at a second detection position on a downstream side from the first detection position in a travel direction of the droplet target each time the light trigger emission signal is input;
   a target image capturing device configured to image the droplet target located in a region including the second detection position each time the imaging trigger signal is input and generate image data of the region and the droplet target located in the region; and
   a processor,
   the processor being configured to change a frequency of the vibrating element each time the target image capturing device generates the image data; generate integrated image data by integrating plural pieces of the image data imaged at different times; specify a position, in a region of the integrated image data having the highest contrast which is a difference in brightness values, of the droplet target in the integrated image data; and set the delay time based on a distance from the position of the identified position to the second detection position.

2. The extreme ultraviolet light generation apparatus according to claim 1,
   wherein the processor sets the delay time by setting a change time $\Delta t1$ of the delay time based on a velocity of the droplet target.

3. The extreme ultraviolet light generation apparatus according to claim 2,
   wherein the processor calculates the velocity of the droplet target from a frequency of the vibrating element and intervals of adjacent combined droplet targets obtained from the image data imaged in advance by the target image capturing device, and
   the combined droplet targets have the intervals between the adjacent droplet targets substantially constant.

4. The extreme ultraviolet light generation apparatus according to claim 2,
   wherein, after setting the delay time, the processor re-sets the delay time as setting a re-change time $\Delta t2$ of the delay time to be less than the change time $\Delta t1$ when a distance from the second detection position to the droplet target in the region is more than a threshold.

5. The extreme ultraviolet light generation apparatus according to claim 1,
   wherein, after setting the delay time, the processor controls a frequency of the vibrating element to keep intervals between the droplet targets adjacent to each other constant.

6. The extreme ultraviolet light generation apparatus according to claim 1, wherein the processor sets an initial setting of the delay time to a design delay time, and the design delay time is a delay time calculated from a design distance from the first detection position to the second detection position and a design velocity of the droplet target when a target application voltage is applied to the vibration element at a target application voltage frequency.

7. The extreme ultraviolet light generation apparatus according to claim 1,
   wherein the droplet target in the region having the highest contrast is the droplet target that is synchronized with the imaging timing of the target image capturing device,
   and the droplet targets in a region other than the region having the highest contrast are not synchronized with the imaging timing of the target image capturing device.

8. The extreme ultraviolet light generation apparatus according to claim 1,
   wherein the position of the droplet target in the integrated image data is a center position of the region having the highest contrast in a traveling direction of the droplet target.

9. The extreme ultraviolet light generation apparatus according to claim 1,
   wherein the integrated image data is data generated by adding the brightness values of each pixels of each of the image data.

10. An electronic device manufacturing method, comprising:
    outputting extreme ultraviolet light generated using an extreme ultraviolet light generation apparatus to an exposure apparatus; and
    exposing a photosensitive substrate to the extreme ultraviolet light in the exposure apparatus to manufacture an electronic device,
    the extreme ultraviolet light generation apparatus including:
    a target supply unit including a tank configured to store a target substance, a pressure regulator configured to regulate pressure in the tank, a nozzle configured to output the target substance from the tank, a vibrating element configured to apply vibration to the target substance to be output from the tank to generate a droplet target of the target substance;
    a target passage detection device configured to detect passage of the droplet target, at a first detection position, supplied from the target supply unit into a chamber and output a passage timing signal at each time of the detection;

a delay circuit configured to receive the passage timing signal and output a light emission trigger signal and an imaging trigger signal at a timing delayed by a delay time from the reception of the passage timing signal;

a laser device configured to generate the extreme ultraviolet light by irradiating, with light, the droplet target at a second detection position on a downstream side from the first detection position in a travel direction of the droplet target each time the light trigger emission signal is input;

a target image capturing device configured to image the droplet target located in a region including the second detection position each time the imaging trigger signal is input and generate image data of the region and the droplet target located in the region; and a processor, the processor being configured to change a frequency of the vibrating element each time the target image capturing device generates the image data; generate integrated image data by integrating plural pieces of the image data imaged at different times; specify a position, in a region of the integrated image data having the highest contrast which is a difference in brightness values, of the droplet target in the integrated image data; and set the delay time based on a distance from the position of the identified position to the second detection position.

11. An electronic device manufacturing method, comprising:

inspecting a defect of a mask by irradiating the mask with extreme ultraviolet light generated using an extreme ultraviolet light generation apparatus;

selecting a mask using a result of the inspection; and exposing and transferring a pattern formed on the selected mask onto a photosensitive substrate, the extreme ultraviolet light generation apparatus including:

a target supply unit including a tank configured to store a target substance, a pressure regulator configured to regulate pressure in the tank, a nozzle configured to output the target substance from the tank, a vibrating element configured to apply vibration to the target substance to be output from the tank to generate a droplet target of the target substance;

a target passage detection device configured to detect passage of the droplet target, at a first detection position, supplied from the target supply unit into a chamber and output a passage timing signal at each time of the detection;

a delay circuit configured to receive the passage timing signal and output a light emission trigger signal and an imaging trigger signal at a timing delayed by a delay time from the reception of the passage timing signal;

a laser device configured to generate the extreme ultraviolet light by irradiating, with light, the droplet target at a second detection position on a downstream side from the first detection position in a travel direction of the droplet target each time the light trigger emission signal is input;

a target image capturing device configured to image the droplet target located in a region including the second detection position each time the imaging trigger signal is input and generate image data of the region and the droplet target located in the region; and a processor, the processor being configured to change a frequency of the vibrating element each time the target image capturing device generates the image data; generate integrated image data by integrating plural pieces of the image data imaged at different times; specify a position, in a region of the integrated image data having the highest contrast which is a difference in brightness values, of the droplet target in the integrated image data; and set the delay time based on a distance from the position of the identified position to the second detection position.

12. An extreme ultraviolet light generation apparatus; comprising:

a target supply unit including a tank configured to store a target substance, a pressure regulator configured to regulate pressure in the tank, a nozzle configured to output the target substance from the tank, a vibrating element configured to apply vibration to the target substance to be output from the tank to generate a droplet target of the target substance;

a target passage detection device configured to detect passage of the droplet target, at a first detection position, supplied from the target supply unit into a chamber and output a passage timing signal at each time of the detection;

a delay circuit configured to receive the passage timing signal and output a light emission trigger signal and an imaging trigger signal at a timing delayed by a delay time from the reception of the passage timing signal;

a laser device configured to generate extreme ultraviolet light by irradiating, with light, the droplet target at a second detection position on a downstream side from the first detection position in a travel direction of the droplet target each time the light trigger emission signal is input;

a target image capturing device configured to image the droplet target located in a region including the second detection position each time the imaging trigger signal is input and generate image data of the region and the droplet target located in the region; and a processor, the processor being configured to control a frequency of the vibrating element to 0; generate integrated image data by integrating plural pieces of the image data imaged at different times; specify a position, in a region of the integrated image data having the highest contrast which is a difference in brightness values, of the droplet target in the integrated image data; and set the delay time based on a distance from the position of the identified position to the second detection position.

13. The extreme ultraviolet light generation apparatus according to claim 12, wherein the processor sets the delay time by setting a change time $\Delta t1$ of the delay time based on a velocity of the droplet target.

14. The extreme ultraviolet light generation apparatus according to claim 13, wherein the processor calculates the velocity of the droplet target from a frequency of the vibrating element and intervals of adjacent combined droplet targets obtained from the image data imaged in advance by the target image capturing device, and the combined droplet targets have the intervals between the adjacent droplet targets substantially constant.

15. The extreme ultraviolet light generation apparatus according to claim 13,
wherein, after setting the delay time, the processor re-sets the delay time as setting a re-change time Δt2 of the delay time to be less than the change time Δt1 when a distance from the second detection position to the droplet target in the region is more than a threshold.

16. The extreme ultraviolet light generation apparatus according to claim 12,
wherein, after setting the delay time, the processor controls a frequency of the vibrating element to keep intervals between the droplet targets adjacent to each other constant.

17. The extreme ultraviolet light generation apparatus according to claim 12, wherein the processor sets an initial setting of the delay time to a design delay time, and the design delay time is a delay time calculated from a design distance from the first detection position to the second detection position and a design velocity of the droplet target when a target application voltage is applied to the vibration element at a target application voltage frequency.

18. The extreme ultraviolet light generation apparatus according to claim 12,
wherein the droplet target in the region having the highest contrast is the droplet target that is synchronized with the imaging timing of the target image capturing device,
and the droplet targets in a region other than the region having the highest contrast are not synchronized with the imaging timing of the target image capturing device.

19. The extreme ultraviolet light generation apparatus according to claim 12,
wherein the position of the droplet target in the integrated image data is a center position of the region having the highest contrast in a traveling direction of the droplet target.

20. The extreme ultraviolet light generation apparatus according to claim 12,
wherein the integrated image data is data generated by adding the brightness values of each pixels of each of the image data.

* * * * *